United States Patent
Ishitani et al.

(10) Patent No.: US 9,614,096 B2
(45) Date of Patent: Apr. 4, 2017

(54) LIQUID CRYSTAL DISPLAY DEVICE

(71) Applicant: Semiconductor Energy Laboratory Co., Ltd., Atsugi-shi, Kanagawa-ken (JP)

(72) Inventors: Tetsuji Ishitani, Isehara (JP); Daisuke Kubota, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 436 days.

(21) Appl. No.: 13/890,421

(22) Filed: May 9, 2013

(65) Prior Publication Data
US 2013/0242223 A1  Sep. 19, 2013

Related U.S. Application Data

(63) Continuation of application No. 12/624,863, filed on Nov. 24, 2009, now Pat. No. 8,441,425.

(30) Foreign Application Priority Data

Nov. 28, 2008 (JP) .................................. 2008-304243

(51) Int. Cl.
H01L 29/786 (2006.01)
H01L 27/12 (2006.01)
(Continued)

(52) U.S. Cl.
CPC ........ *H01L 29/7869* (2013.01); *G02F 1/1368* (2013.01); *G02F 1/133514* (2013.01);
(Continued)

(58) Field of Classification Search
CPC .............. G02F 2001/136222; H01L 29/78618
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1688783 A | 8/2006 |
| EP | 1 737 044 A | 12/2006 |

(Continued)

OTHER PUBLICATIONS

Song.I et al., "Short Channel Characteristics of Gallium-Indium-Zinc-Oxide Thin Film Transistors for Three-Dimensional Stacking Memory,", IEEE Electron Device Letters, Jun. 1, 2008, vol. 29, No. 6, pp. 549-552.

(Continued)

*Primary Examiner* — Nathanael R Briggs
*Assistant Examiner* — Alexander Gross
(74) *Attorney, Agent, or Firm* — Robinson Intellectual Property Law Office; Eric J. Robinson

(57) ABSTRACT

To provide a liquid crystal display device suitable for a thin film transistor which uses an oxide semiconductor. In a liquid crystal display device which includes a thin film transistor including an oxide semiconductor layer, a film having a function of attenuating the intensity of transmitting visible light is used as an interlayer film which covers at least the oxide semiconductor layer. As the film having a function of attenuating the intensity of transmitting visible light, a coloring layer can be used and a light-transmitting chromatic color resin layer is preferably used. An interlayer film which includes a light-transmitting chromatic color resin layer and a light-blocking layer may be formed in order that the light-blocking layer is used as a film having a function of attenuating the intensity of transmitting visible light.

21 Claims, 19 Drawing Sheets

(51) Int. Cl.
*G02F 1/1335* (2006.01)
*G02F 1/1368* (2006.01)
*G02F 1/1362* (2006.01)

(52) U.S. Cl.
CPC ...... *H01L 27/1225* (2013.01); *H01L 27/1248* (2013.01); *G02F 1/136209* (2013.01); *G02F 2001/136222* (2013.01); *H01L 29/78618* (2013.01)

(56) References Cited

U.S. PATENT DOCUMENTS

| | | | |
|---|---|---|---|
| 5,769,963 A * | 6/1998 | Fujioka | H01L 31/03682 136/249 |
| 5,771,082 A | 6/1998 | Chaudet et al. | |
| 5,886,762 A | 3/1999 | Lee et al. | |
| 6,191,835 B1 | 2/2001 | Choi | |
| 6,278,504 B1 | 8/2001 | Sung | |
| 6,294,274 B1 | 9/2001 | Kawazoe et al. | |
| 6,429,916 B1 | 8/2002 | Nakata et al. | |
| 6,563,174 B2 | 5/2003 | Kawasaki et al. | |
| 6,727,522 B1 | 4/2004 | Kawasaki et al. | |
| 6,778,232 B2 | 8/2004 | Nakata et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,075,614 B2 | 7/2006 | Izumi et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,477,345 B2 | 1/2009 | Kim et al. | |
| 7,501,293 B2 | 3/2009 | Ito et al. | |
| 7,576,824 B2 | 8/2009 | Kim | |
| 7,576,829 B2 | 8/2009 | Kikuchi et al. | |
| 7,639,332 B2 | 12/2009 | Miyachi et al. | |
| 7,674,650 B2 | 3/2010 | Akimoto et al. | |
| 7,732,819 B2 | 6/2010 | Akimoto et al. | |
| 7,773,182 B2 | 8/2010 | Kimura et al. | |
| 7,821,604 B2 | 10/2010 | Yoshimoto | |
| 7,843,541 B2 | 11/2010 | Haruyama | |
| 7,872,722 B2 | 1/2011 | Kimura | |
| 7,880,848 B2 | 2/2011 | Kimura et al. | |
| 7,995,180 B2 | 8/2011 | Yoshimoto | |
| 8,058,647 B2 | 11/2011 | Kuwabara et al. | |
| 8,064,017 B2 | 11/2011 | Kurasawa | |
| 8,102,476 B2 | 1/2012 | Son et al. | |
| 8,107,038 B2 | 1/2012 | Kim et al. | |
| 8,130,354 B2 | 3/2012 | Kimura | |
| 8,233,120 B2 | 7/2012 | Kim et al. | |
| 8,304,765 B2 | 11/2012 | Yamazaki et al. | |
| 8,780,307 B2 | 7/2014 | Kimura | |
| 8,964,156 B2 | 2/2015 | Kimura | |
| 2001/0046027 A1 | 11/2001 | Tai et al. | |
| 2001/0048489 A1 | 12/2001 | Izumi et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0077134 A1 * | 4/2004 | Takayama | H01L 21/324 438/151 |
| 2004/0127038 A1 | 7/2004 | Carcia et al. | |
| 2004/0263752 A1 | 12/2004 | Kim | |
| 2005/0017302 A1 | 1/2005 | Hoffman | |
| 2005/0078256 A1 * | 4/2005 | Hong | 349/141 |
| 2005/0199959 A1 | 9/2005 | Chiang et al. | |
| 2005/0243235 A1 | 11/2005 | Lee | |
| 2006/0001803 A1 * | 1/2006 | Park | 349/113 |
| 2006/0006363 A1 | 1/2006 | Heckmeier et al. | |
| 2006/0035452 A1 | 2/2006 | Carcia et al. | |
| 2006/0043377 A1 | 3/2006 | Hoffman et al. | |
| 2006/0087599 A1 * | 4/2006 | Sohn | 349/43 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0227283 A1 | 10/2006 | Ooi et al. | |
| 2006/0228974 A1 | 10/2006 | Thelss et al. | |
| 2006/0231882 A1 | 10/2006 | Kim et al. | |
| 2006/0232529 A1 * | 10/2006 | Midorikawa | 345/87 |
| 2006/0238135 A1 | 10/2006 | Kimura | |
| 2006/0243979 A1 | 11/2006 | Park et al. | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0069209 A1 * | 3/2007 | Jeong et al. | 257/57 |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0178413 A1 * | 8/2007 | Choi et al. | 430/316 |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0284627 A1 | 12/2007 | Kimura | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0136990 A1 * | 6/2008 | Kimura | 349/46 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0231779 A1 * | 9/2008 | Shin et al. | 349/106 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0259254 A1 * | 10/2008 | Kikuchi et al. | 349/88 |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0141203 A1 | 6/2009 | Son et al. | |
| 2009/0152506 A1 | 6/2009 | Umeda et al. | |

(56) References Cited

U.S. PATENT DOCUMENTS

| | | |
|---|---|---|
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0252826 A1 | 10/2010 | Yamazaki et al. |
| 2012/0162561 A1 | 6/2012 | Kimura |
| 2012/0194758 A1 | 8/2012 | Kimura et al. |
| 2015/0248044 A1 | 9/2015 | Kimura |

FOREIGN PATENT DOCUMENTS

| | | |
|---|---|---|
| EP | 1793266 A | 6/2007 |
| EP | 2 226 847 A | 9/2010 |
| EP | 2270583 A | 1/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-231123 A | 8/2000 |
| JP | 2002-076356 A | 3/2002 |
| JP | 2002-236286 A | 8/2002 |
| JP | 2002-289859 A | 10/2002 |
| JP | 2003-029297 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-189763 A | 7/2006 |
| JP | 2007-096055 | 4/2007 |
| JP | 2007-123861 | 5/2007 |
| JP | 2007-165861 | 6/2007 |
| JP | 2007-183583 A | 7/2007 |
| JP | 2008-083364 A | 4/2008 |
| JP | 2008-116502 A | 5/2008 |
| JP | 2008-130689 A | 6/2008 |
| JP | 2008-233484 A | 10/2008 |
| KR | 1994-0703039 A | 9/1994 |
| KR | 1998-0040331 A | 8/1998 |
| KR | 2000-0048021 A | 7/2000 |
| KR | 2002-0047602 A | 6/2002 |
| KR | 10-0359796 | 1/2003 |
| KR | 2003-0073878 A | 9/2003 |
| KR | 2005-0062450 A | 6/2005 |
| KR | 2005-0086567 A | 8/2005 |
| KR | 2005-0096367 A | 10/2005 |
| KR | 2006-0104994 A | 10/2006 |
| KR | 2006-0107497 A | 10/2006 |
| KR | 2008-0039287 A | 5/2008 |
| KR | 2008-0039313 A | 5/2008 |
| KR | 2008-0045544 A | 5/2008 |
| KR | 2008-0049967 A | 6/2008 |
| TW | I293398 | 2/2008 |
| TW | I299212 | 7/2008 |
| TW | I304511 | 12/2008 |
| WO | 2004/114391 | 12/2004 |
| WO | 2005-090520 | 9/2005 |

OTHER PUBLICATIONS

Taiwanese Office Action (Application No. 98139746) Dated Oct. 6, 2014.
Search Report (Application No. 09177227.7) dated Mar. 15, 2010.
European Office Action (Application No. 09177227.7) dated Sep. 19, 2011.
Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda et al., "Full-Functional System Liquid Crystal Display Using Cg-Silicon Technology," SID Digest '04: SID International Symposium Digest of Technical Papers, 2004, vol. 35, pp. 860-863.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Prins et al., "A Ferroelectric Transparent Thin-Film Transistor," Appl. Phys. Lett. (Applied Physics Letters), Jun. 17, 1996, vol. 68, No. 25, pp. 3650-3652.
Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.
Kimizuka et al., "Syntheses and Single-Crystal Data of Homologous Compounds, $In_2O_3(ZnO)_m$, (m=3, 4, and 5), $InGaO_{3(ZnO)3}$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.
Nomura et al., "Thin-Film Transistor Fabricated in Single-Crystalline Transparent Oxide Semiconductor," Science, May 23, 2003, vol. 300, No. 5623, pp. 1269-1272.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Li et al., "Modulated Structures of Homologous Compounds $InMO_3(ZnO)_m$, (M=In,Ga; m=Integer) Described by Four-Dimensional Superspace Group," Journal of Solid State Chemistry, 1998, vol. 139, pp. 347-355.
Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

(56) References Cited

OTHER PUBLICATIONS

Kanno et al., "White Stacked Electrophosphorecent Organic Light-Emitting Devices Employing MoO₃ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn-Oxide TFTs," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 in. QVGA AMOLED Display Using In—Ga—Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

(56) References Cited

OTHER PUBLICATIONS

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.

Korean Office Action (Application No. 2014-0155638) Dated Nov. 4, 2015.

Korean Office Action (Application No. 2009-0114554) Dated Nov. 4, 2015.

Korean Office Action (Application No. 2016-0097267) Dated Sep. 1, 2016.

Korean Office Action (Application No. 2009-0114564) Dated May 9, 2016.

Korean Office Action (Application No. 2014-0155638) Dated May 9, 2016.

Korean Office Action (Application No. 2016-0097267) Dated Feb. 3, 2017.

* cited by examiner

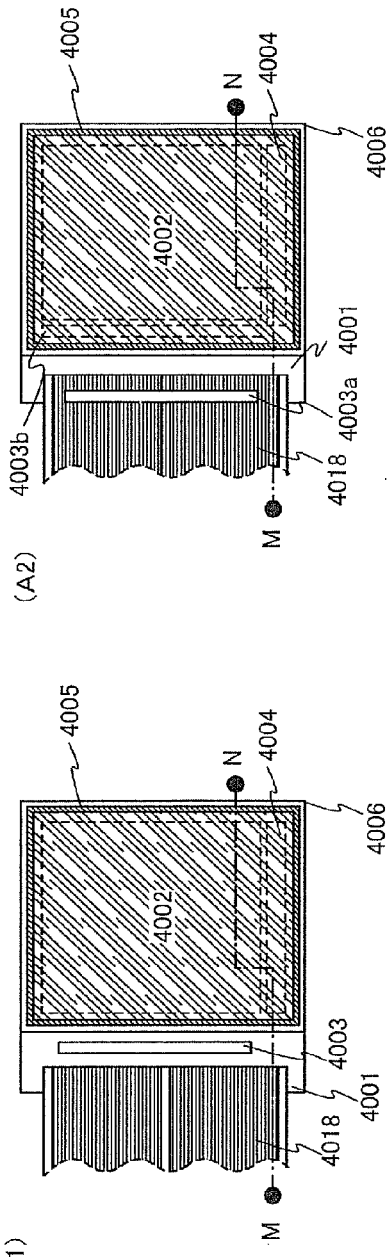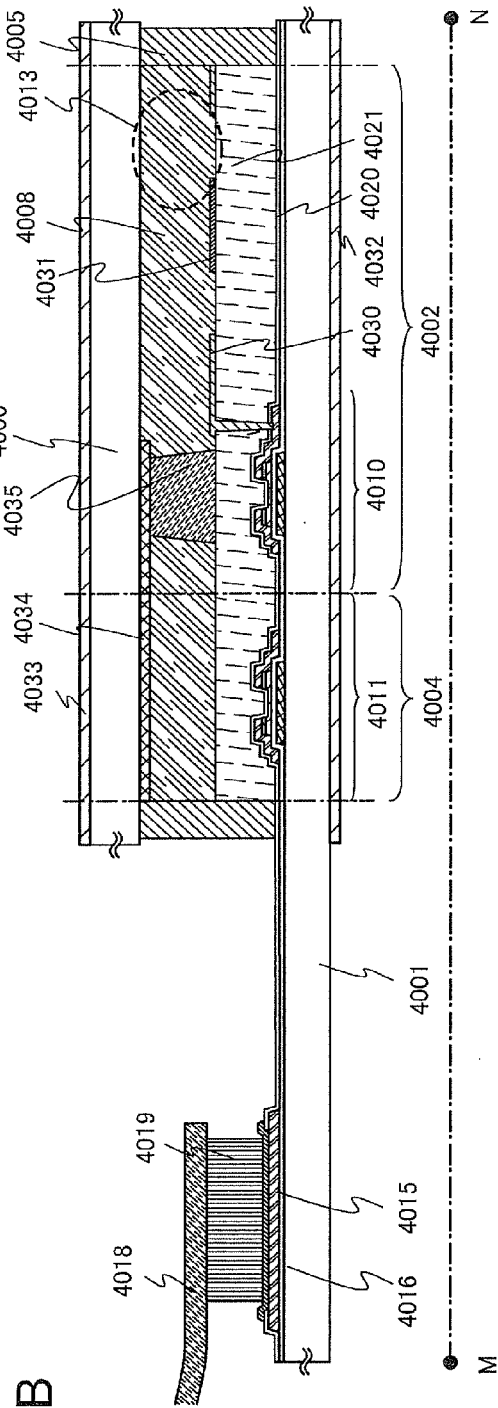
FIG. 12A
FIG. 12B

मेरा

# LIQUID CRYSTAL DISPLAY DEVICE

BACKGROUND OF THE INVENTION

1. Field of the Invention

The present invention relates to a liquid crystal display device in which an oxide semiconductor is used and a manufacturing method thereof.

2. Description of the Related Art

As typically seen in a liquid crystal display device, a thin film transistor formed over a flat plate such as a glass substrate is manufactured using amorphous silicon or polycrystalline silicon. A thin film transistor manufactured using amorphous silicon has low field effect mobility, but can be formed over a large glass substrate. In contrast, a thin film transistor manufactured using crystalline silicon has high field effect mobility, but due to a crystallization step such as laser annealing, such a transistor is not always suitable for being formed over a large glass substrate.

In view of the foregoing, attention has been drawn to a technique by which a thin film transistor is manufactured using an oxide semiconductor and such a transistor is applied to an electronic device or an optical device. For example, Patent Document 1 and Patent Document 2 disclose a technique by which a thin film transistor is manufactured using zinc oxide or an In—Ga—Zn—O-based oxide semiconductor for an oxide semiconductor film and such a transistor is used as a switching element or the like of an image display device.

The field effect mobility of a thin film transistor that uses an oxide semiconductor for a channel formation region is higher than that of a thin film transistor that uses amorphous silicon. The oxide semiconductor film can be formed by a sputtering method or the like at a temperature of 300° C. or less. Its manufacturing process is easier than that of a thin film transistor that uses polycrystalline silicon.

An oxide semiconductor is a transparent semiconductor which transmits light in a visible wavelength range; accordingly, it is said that by using the oxide semiconductor for a pixel of a display device, a higher aperture ratio can be obtained.

Such an oxide semiconductor is expected to be used for forming a thin film transistor on a glass substrate, a plastic substrate, or the like, and to be applied to a display device.

REFERENCE

[Patent Document 1] Japanese Published Patent Application No. 2007-123861

[Patent Document 2] Japanese Published Patent Application No. 2007-096055

SUMMARY OF THE INVENTION

Therefore, it is an object to provide a liquid crystal display device suitable for a thin film transistor that uses an oxide semiconductor.

In a liquid crystal display device which includes a thin film transistor including an oxide semiconductor layer, a film having a function of attenuating the intensity of transmitting visible light is used as an interlayer film which covers at least the oxide semiconductor layer. The film having a function of attenuating the intensity of transmitting visible light is a film having a transmittance of visible light lower than the oxide semiconductor layer. As the film having a function of attenuating the intensity of transmitting visible light, a coloring layer can be used and a light-transmitting chromatic color resin layer is preferably used. An interlayer film which includes a light-transmitting chromatic color resin layer and a light-blocking layer may be formed in order that the light-blocking layer is used as a film having a function of attenuating the intensity of transmitting visible light.

When a coloring layer of a light-transmitting chromatic color resin layer is used as an interlayer film provided over a thin film transistor, the intensity of incident light on a semiconductor layer of the thin film transistor can be attenuated without reduction in an aperture ratio of a pixel. Accordingly, electric characteristics of the thin film transistor can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Chromatic colors are colors except achromatic colors such as black, gray, and white. The light-transmitting chromatic color resin layer is formed using a material which transmits only light of a chromatic color which the material is colored in so as to serve as a color filter. As a chromatic color, red, green, blue, or the like can be used. Alternatively, cyan, magenta, yellow, or the like may be used. "Transmitting only light of a chromatic color which a material is colored in" means that light transmitted through the light-transmitting chromatic color resin layer has a peak at the wavelength of the chromatic color light.

The thickness of the light-transmitting chromatic color resin layer is preferably controlled as appropriate and optimized in consideration of the relation between the concentration of the coloring material to be included and the transmittance, in order that the light-transmitting chromatic color resin layer functions as a color filter layer. In the case where the interlayer film is formed of a plurality of thin films, if at least one layer thereof is a light-transmitting chromatic color resin layer, the interlayer film can function as a color filter.

In the case where the thickness varies depending on the chromatic colors or in the case where there is surface unevenness due to a thin film transistor, an insulating layer which transmits light in a visible wavelength range (a so-called colorless, transparent insulating layer) may be stacked for planarization of the surface of the interlayer film. The planarization of the interlayer film enables favorable coverage by a pixel electrode layer or a common electrode layer to be formed thereover and uniform gap (thickness) of a liquid crystal layer, whereby the visibility of the liquid crystal display device is increased and higher image quality can be achieved.

When a light-blocking layer (black matrix) is used in the interlayer film provided over the thin film transistor, the light-blocking layer can block incident light on the semiconductor layer of the thin film transistor; accordingly, electric characteristics of the thin film transistor can be prevented from being varied due to photosensitivity of the oxide semiconductor and can be stabilized. Further, the light-blocking layer can prevent light leakage to an adjacent pixel, which enables higher contrast and higher definition display. Therefore, high definition and high reliability of the liquid crystal display device can be achieved.

In this specification, a substrate over which a thin film transistor, a pixel electrode layer, a common electrode layer, and an interlayer film are formed is called an element substrate (a first substrate), and a substrate which is positioned opposite from the element substrate with a liquid crystal layer interposed therebetween is called a counter substrate (a second substrate).

The light-blocking layer can be formed on either the counter substrate side or the element substrate side of the liquid crystal display device. Accordingly, contrast can be increased and the thin film transistor can be stabilized more. In the case where the light-blocking layer is formed in a region corresponding to a thin film transistor (at least in a region which overlaps with a semiconductor layer of a thin film transistor), electric characteristics of the thin film transistor can be prevented from being varied due to incident light from the counter substrate. In the case of forming the light-blocking layer on the counter substrate side, the light-blocking layer may be formed in a region which corresponds to a thin film transistor with a liquid crystal layer interposed therebetween (at least in a region which overlaps with a semiconductor layer of a thin film transistor). In the case of forming the light-blocking layer on the element substrate side, the light-blocking layer may be formed directly on the thin film transistor (at least in a region which covers a semiconductor layer of the thin film transistor) or formed over the thin film transistor with an insulating layer interposed therebetween.

In the case of providing the light-blocking layer also on the counter substrate side, there is a case in which light from the element substrate and light from the counter substrate to the semiconductor layer of the thin film transistor can be blocked by a light-blocking wiring layer, electrode layer, or the like. Thus, the light-blocking layer need not always be formed to cover the thin film transistor.

An embodiment of the invention disclosed in this specification includes a thin film transistor in which an oxide semiconductor layer overlapping with a gate electrode layer serves as a channel formation region; a pixel electrode layer electrically connected to the thin film transistor; an interlayer film provided between the thin film transistor and the pixel electrode layer; and a liquid crystal layer provided over the thin film transistor, the pixel electrode layer, and the interlayer film, in which the interlayer film is a light-transmitting chromatic color resin layer which has a transmittance lower than the oxide semiconductor layer, and in which the light-transmitting chromatic color resin layer is provided so as to overlap with the pixel electrode layer and cover the oxide semiconductor layer.

Another embodiment of the invention disclosed in this specification includes a thin film transistor in which an oxide semiconductor layer overlapping with a gate electrode layer serves as a channel formation region; a pixel electrode layer electrically connected to the thin film transistor; an interlayer film provided between the thin film transistor and the pixel electrode layer; and a liquid crystal layer provided over the thin film transistor, the pixel electrode layer, and the interlayer film, in which the interlayer film includes a light-blocking layer and a light-transmitting chromatic color resin layer which has a transmittance lower than the oxide semiconductor layer, in which the light-blocking layer is provided so as to cover the oxide semiconductor layer, and in which the light-transmitting chromatic color resin layer is provided so as to overlap with the pixel electrode layer.

Note that ordinal numbers such as "first" and "second" in this specification are used for convenience. Therefore, they do not denote the order of steps, the stacking order of layers, and particular names which specify the invention.

In this specification, a semiconductor device refers to all types of devices which can function by utilizing semiconductor characteristics. An electro-optical device, a semiconductor circuit, and an electronic device are all included in the category of the semiconductor device.

In a liquid crystal display device which includes a thin film transistor formed by using an oxide semiconductor layer for a channel, an interlayer film which covers at least the oxide semiconductor layer is formed using a material which attenuates the intensity of transmitting visible light. Accordingly, operation characteristics of the thin film transistor can be stabilized without reduction in an aperture ratio.

BRIEF DESCRIPTION OF THE DRAWINGS

In the accompanying drawings:

FIGS. 12A1, 12A2, and 12B illustrate liquid crystal display devices.

DETAILED DESCRIPTION OF THE INVENTION

Figure 1:
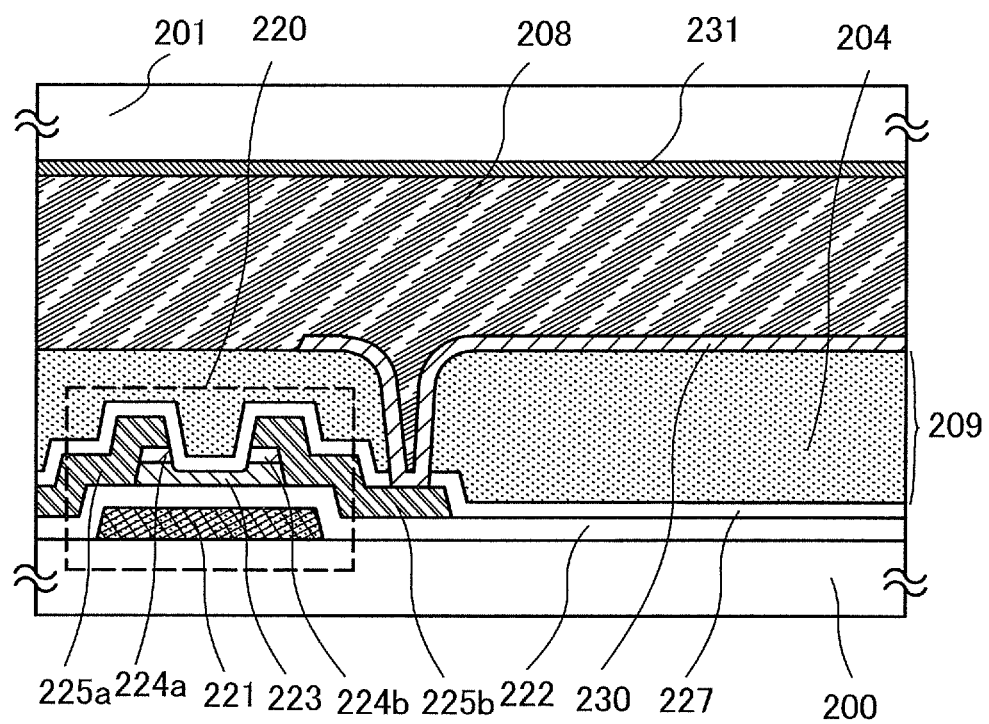
FIG. 1 illustrates a liquid crystal display device.

Embodiments will be described with reference to the accompanying drawings. However, the present invention is not limited to the following description, and it will be easily understood by those skilled in the art that various changes and modifications can be made in modes and details without departing from the spirit and scope of the present invention. Therefore, the present invention should not be construed as being limited to the description of the following embodiments. Note that a common reference numeral refers to the same part or a part having a similar function throughout the drawings in the structures described below, and the description thereof is omitted.

Embodiment 1

Liquid crystal display devices and manufacturing methods thereof will be described with reference to FIG. 1, FIG. 2, and FIGS. 17A and 17B.

FIG. 1, FIG. 2, and FIGS. 17A and 17B are cross-sectional views of liquid crystal display devices.

Figure 2:
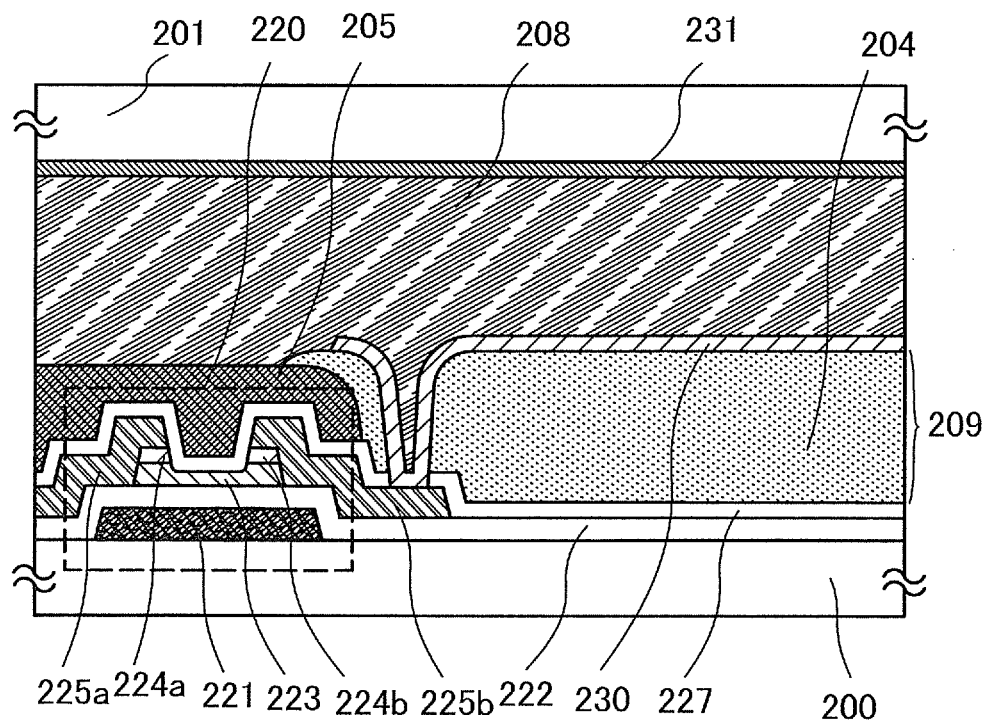
FIG. 2 illustrates a liquid crystal display device.

In FIG. 1 and FIG. 2, an element layer 203 (see FIGS. 17A and 17B) is formed over a first substrate 200 which is an element substrate, an interlayer film 209 is formed over the element layer 203, and a pixel electrode layer 230 is provided over the interlayer film 209. A liquid crystal layer 208 is sealed between the pixel electrode layer 230 and a counter electrode layer 231 formed on a second substrate 201 which is a counter substrate.

A mode of a liquid crystal display device illustrated in FIG. 1 includes a plurality of pixels in matrix. In each of the pixels, a thin film transistor including an oxide semiconductor layer, an interlayer film over the thin film transistor, a pixel electrode layer over the interlayer film, and a liquid crystal layer over the pixel electrode layer are included, and the interlayer film is a light-transmitting chromatic color resin layer.

The element layer 203 (see FIGS. 17A and 17B) is provided with a plurality of pixels in matrix, and each of the pixels includes a thin film transistor 220 including an oxide semiconductor layer. The thin film transistor 220 is an inverted staggered thin film transistor, which includes, over the first substrate 200 which is a substrate having an insulating surface, a gate electrode layer 221, a gate insulating layer 222, a semiconductor layer 223, n$^+$ layers 224a and 224b serving as a source region and a drain region, and wiring layers 225a and 225b serving as a source electrode layer and a drain electrode layer. In addition, the thin film transistor 220 is covered with an insulating film 227.

The interlayer film 209 of the liquid crystal display device illustrated in FIG. 1 includes a light-transmitting chromatic color resin layer 204 as a film having a function of attenuating the intensity of transmitting visible light. The transmittance of visible light of the light-transmitting chromatic color resin layer 204 is lower than that of the semiconductor layer 223 which is an oxide semiconductor layer.

When a coloring layer of a light-transmitting chromatic color resin layer is used as the interlayer film 209 provided over the thin film transistor 220, the intensity of incident light on the semiconductor layer 223 of the thin film transistor 220 can be attenuated without reduction in an aperture ratio of a pixel. Accordingly, electric characteristics of the thin film transistor 220 can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Chromatic colors are colors except achromatic colors such as black, gray, and white. The coloring layer is formed using a material which transmits only light of a chromatic color which the material is colored in so as to serve as a color filter. As a chromatic color, red, green, blue, or the like can be used. Alternatively, cyan, magenta, yellow, or the like may be used. "Transmitting only light of a chromatic color which a material is colored in" means that light transmitted through the coloring layer has a peak at the wavelength of the chromatic color light.

The thickness of the light-transmitting chromatic color resin layer 204 is preferably controlled as appropriate and optimized in consideration of the relation between the concentration of the coloring material to be included and the transmittance, in order that the light-transmitting chromatic color resin layer 204 functions as a coloring layer (a color filter). In the case where the interlayer film 209 is formed of a plurality of thin films, if at least one layer thereof is a light-transmitting chromatic color resin layer, the interlayer film 209 can function as a color filter.

In the case where the thickness of the light-transmitting chromatic color resin layer varies depending on the chromatic colors or in the case where there is surface unevenness due to a light-blocking layer or a thin film transistor, an insulating layer which transmits light in a visible wavelength range (a so-called colorless, transparent insulating layer) may be stacked for planarization of the surface of the interlayer film. The planarization of the interlayer film enables favorable coverage by a pixel electrode layer or a common electrode layer to be formed thereover and uniform gap (thickness) of a liquid crystal layer, whereby the visibility of the liquid crystal display device is increased and higher image quality can be achieved.

As the film having a function of attenuating the intensity of transmitting visible light, a coloring layer serving as a light-blocking layer can also be used. A liquid crystal display device illustrated in FIG. 2 is an example in which the interlayer film 209 includes the light-transmitting chromatic color resin layer 204 and the light-blocking layer 205 and in which the light-blocking layer 205 is used as a film having a function of attenuating the intensity of transmitting visible light provided over the semiconductor layer 223. The transmittance of visible light of the light-blocking layer 205 is lower than that of the semiconductor layer 223 which is an oxide semiconductor layer.

The mode of the liquid crystal display device illustrated in FIG. 2 includes a plurality of pixels in matrix. In each of the pixels, a thin film transistor including an oxide semiconductor layer, an interlayer film including a light-blocking layer and a light-transmitting chromatic color resin layer, a pixel electrode layer, and a liquid crystal layer over the pixel electrode layer are included. In the interlayer film, the light-blocking layer is provided over the thin film transistor, and the pixel electrode layer is provided over the light-transmitting chromatic color resin layer.

As the light-transmitting chromatic color resin layer 204, a light-transmitting organic resin, a chromatic pigment, or a dye can be used, and an organic resin in which a pigment, a dye, or the like is mixed may be used. As the light-transmitting organic resin, a photosensitive or non-photosensitive resin can be used.

The formation method of the light-transmitting chromatic color resin layer 204 is not particularly limited, and a wet method such as spin coating, dip coating, spray coating, droplet discharging (e.g., ink jetting, screen printing, or offset printing), or the like may be used in accordance with the material. If needed, an etching method (dry etching or wet etching) may be employed to form a desired pattern.

When the light-blocking layer 205 (black matrix) is used in the interlayer film 209 provided over the thin film transistor 220, the light-blocking layer 205 can block incident light on the semiconductor layer 223 of the thin film transistor 220; accordingly, electric characteristics of the thin film transistor 220 can be prevented from being varied due to photosensitivity of the oxide semiconductor and can be stabilized. Further, the light-blocking layer 205 can prevent light leakage to an adjacent pixel, which enables higher contrast and higher definition display. Therefore, high definition and high reliability of the liquid crystal display device can be achieved.

A light-blocking layer may be further formed on the counter substrate side of the liquid crystal display device. Accordingly, contrast can be increased and the thin film transistor can be stabilized more. In the case of forming the light-blocking layer on the counter substrate side, if the light-blocking layer is formed in a region corresponding to the thin film transistor with the liquid crystal layer interposed therebetween (at least in a region which overlaps with the semiconductor layer of the thin film transistor), electric characteristics of the thin film transistor can be prevented from being varied due to incident light from the counter substrate.

In the case of forming the light-blocking layer on the counter substrate side, there is a case in which light from the element substrate and light from the counter substrate to the semiconductor layer of the thin film transistor can be blocked by a light-blocking wiring layer, electrode layer, or the like. Thus, the light-blocking layer need not always be formed to cover the thin film transistor.

The light-blocking layer 205 is formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, aluminum, or the like, for example.

The formation method of the light-blocking layer 205 is not particularly limited, and a dry method such as vapor deposition, sputtering, CVD, or the like or a wet method such as spin coating, dip coating, spray coating, droplet discharging (e.g., ink jetting, screen printing, or offset printing), or the like may be used in accordance with the material. If needed, an etching method (dry etching or wet etching) may be employed to form a desired pattern.

In this specification, a thin film expressed by $InMO_3(ZnO)_m$ (m>0) is preferably used for an oxide semiconductor. A thin film of $InMO_3(ZnO)_m$ (m>0) is formed, and the thin film transistor 220 uses the thin film for the semiconductor layer 223. Note that M represents one or more of metal elements selected from gallium (Ga), iron (Fe), nickel (Ni), manganese (Mn), aluminum (Al), and cobalt (Co). As well as the case where only Ga is contained as M, there is a case where Ga and any of the above metal elements except Ga, for example, Ga and Ni or Ga and Fe are contained as M. Moreover, in the oxide semiconductor, in some cases, a transition metal element such as Fe or Ni or an oxide of the transition metal is contained as an impurity element in addition to the metal element contained as M. For example, an In—Ga—Zn—O based non-single-crystal film can be used as an oxide semiconductor layer. However, the semiconductor layer 223 is not limited to an oxide semiconductor layer including a material whose composition formula is represented as $InMO_3(ZnO)_m$ (m>0) as long as it contains at least one of indium, gallium, zinc, and tin. For example, an oxide semiconductor layer formed using zinc oxide (ZnO), tin oxide (SnO), indium zinc oxide (IZO), indium tin oxide (ITO), indium tin oxide containing silicon oxide (ITSO), indium zinc oxide containing silicon oxide, gallium-doped zinc oxide (GZO), or the like may be used.

When M is gallium (Ga) in the $InMO_3(ZnO)_m$ (m>0) film (layer), this thin film is also called an In—Ga—Zn—O based non-single-crystal film in this specification. Even after the In—Ga—Zn—O based non-single-crystal film formed by a sputtering method is subjected to heat treatment at 200° C. to 500° C., typically 300° C. to 400° C. for 10 minutes to 100 minutes, an amorphous structure is observed in the In—Ga—Zn—O based non-single-crystal film by X-ray diffraction (XRD). In addition, a thin film transistor having electric characteristics such as an on/off ratio of greater than or equal to $10^9$ and a mobility of greater than or equal to 10 at a gate voltage of ±20 V can be manufactured. The In—Ga—Zn—O based non-single-crystal film formed by a sputtering method using a target in which $In_2O_3$, $Ga_2O_3$, and ZnO are contained at a ratio of 1:1:1 has photosensitivity to a wavelength of 450 nm or lower.

The structure of the thin film transistor formed in the liquid crystal display device is not particularly limited. The thin film transistor may have a single-gate structure in which one channel formation region is formed, a double-gate structure in which two channel formation regions are formed, or a triple-gate structure in which three channel formation regions are formed. In addition, the transistor in the peripheral driver circuit region may also have a single-gate structure, a double-gate structure, or a triple-gate structure.

The thin film transistor may have a top-gate structure (e.g., a staggered structure or a coplanar structure), a bottom-gate structure (e.g., an inverted staggered structure or an inverted coplanar structure), a dual-gate structure including two gate electrode layers provided over and under a channel region each with a gate insulating film interposed therebetween, or other structures.

Although not illustrated in FIG. 1 and FIG. 2, an optical film such as an alignment film, a polarizing plate, a retardation plate, or an anti-reflection film may be provided as appropriate. For example, circular polarization may be employed using a polarizing plate or a retardation plate. Further, a backlight, a sidelight, or the like may be used as a light source.

Figure 17A:
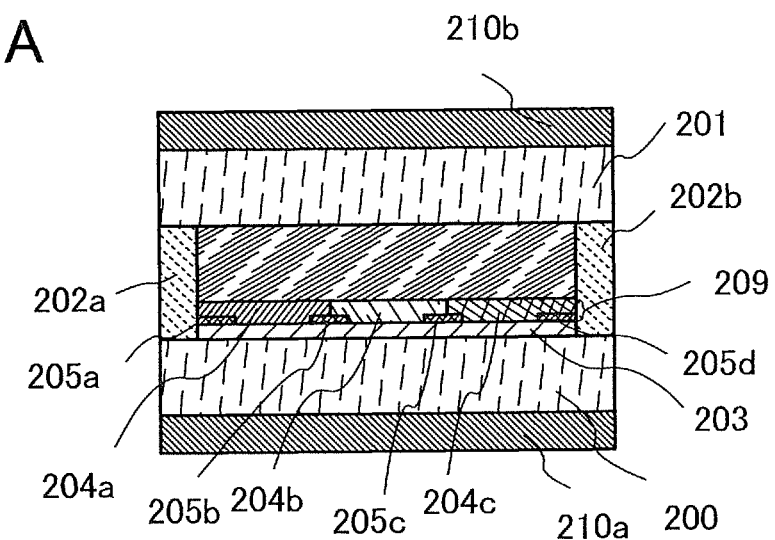
FIGS. 17A and 17B each illustrate a liquid crystal display device.
Figure 17B:
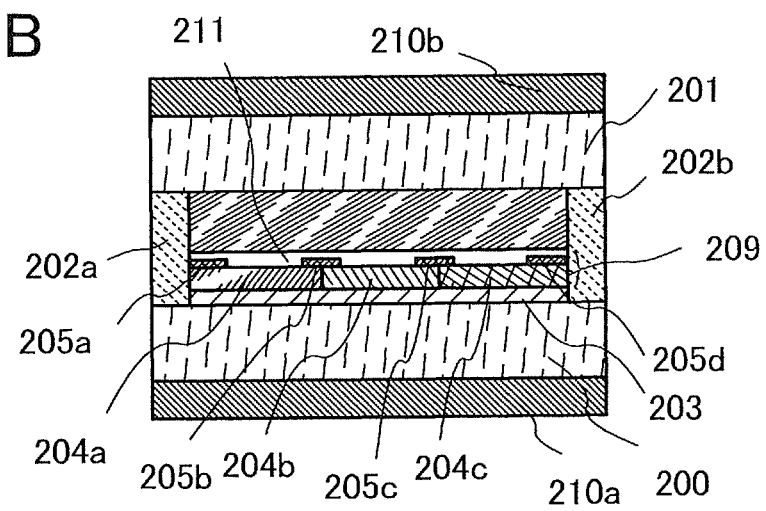

The light-blocking layer may be provided so as to be stacked over or below the light-transmitting chromatic color resin layer. Examples of the stacked structure of the light-blocking layer and the light-transmitting chromatic color resin layer are illustrated in FIGS. 17A and 17B. In FIGS. 17A and 17B, the element layer 203 is formed over the first substrate 200 which is an element substrate and the interlayer film 209 is formed over the element layer 203. The interlayer film 209 includes light-transmitting chromatic color resin layers 204a, 204b, and 204c and light-blocking layers 205a, 205b, 205c, and 205d. The light-blocking layers 205a, 205b, 205c, and 205d are formed at boundaries of the light-transmitting chromatic color resin layers 204a, 204b, and 204c. Note that the pixel electrode layer and the common electrode layer are omitted in FIGS. 17A and 17B.

A plurality of chromatic colors can be used, and for example, the liquid crystal display device in FIGS. 17A and 17B uses a coloring layer of red, a coloring layer of green, and a coloring layer of blue as the light-transmitting chromatic color resin layer 204a, the light-transmitting chromatic color resin layer 204b, and the light-transmitting chromatic color resin layer 204c, respectively; thus, light-transmitting chromatic color resin layers of plural colors are used.

FIGS. 17A and 17B illustrate examples in which thin films that are thinner than the light-transmitting chromatic color resin layers are used as the light-blocking layers and the light-blocking layers are stacked below or over the light-transmitting chromatic color resin layers. As such light-blocking layers, thin films of light-blocking inorganic films (e.g., metal films) are preferable.

In FIG. 17A, thin films of the light-blocking layers 205a, 205b, 205c, and 205d are formed over the element layer 203, and the light-transmitting chromatic color resin layers 204a, 204b, and 204c are stacked over the light-blocking layers 205a, 205b, 205c, and 205d. In FIG. 17B, the light-transmitting chromatic color resin layers 204a, 204b, and 204c are formed over the element layer 203; thin films of the light-blocking layers 205a, 205b, 205c, and 205d are stacked over the light-transmitting chromatic color resin layers 204a, 204b, and 204c; and an insulating film 211 is formed as an overcoat film over the light-blocking layers 205a, 205b, 205c, and 205d. The element layer, the light-blocking layers, and the light-transmitting chromatic color resin layers may be stacked directly as illustrated in FIG. 17B, or they may have an insulating film over, below, or between the layers.

A liquid crystal material of the liquid crystal layer 208 can be appropriately selected from various liquid crystals such as a lyotropic liquid crystal, a thermotropic liquid crystal, a low molecular liquid crystal, a high molecular liquid crystal, a discotic liquid crystal, a ferroelectric liquid crystal, an anti-ferroelectric liquid crystal, and the like.

As sealants 202a and 202b, it is typically preferable to use a visible light curable resin, an ultraviolet curable resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may also be included in the sealants 202a and 202b.

In this specification, in the case where the liquid crystal display device is a transmissive liquid crystal display device (or a transflective liquid crystal display device) which performs display by transmitting light from a light source, it is necessary that light be transmitted at least through a pixel region. Therefore, the first substrate, the second substrate, and thin films included in the element layer such as a pixel electrode layer, a common electrode layer, other insulating films, and a conductive film, which exist in the pixel region where light is transmitted, all have a light-transmitting property with respect to light in a visible wavelength range.

As the first substrate 200 and the second substrate 201, a glass substrate of barium borosilicate glass, aluminoborosilicate glass, or the like, a quartz substrate, a plastic substrate, or the like can be used. In a liquid crystal display device which includes a thin film transistor formed by using an oxide semiconductor layer for a channel, an interlayer film which covers at least the oxide semiconductor layer is formed using a material which attenuates the intensity of transmitting visible light. Accordingly, operation characteristics of the thin film transistor can be stabilized without reduction in an aperture ratio. Therefore, the liquid crystal display device including the thin film transistor can have high reliability.

Embodiment 2

A liquid crystal display device will be described with reference to FIGS. 18A and 18B.

Figure 18A:
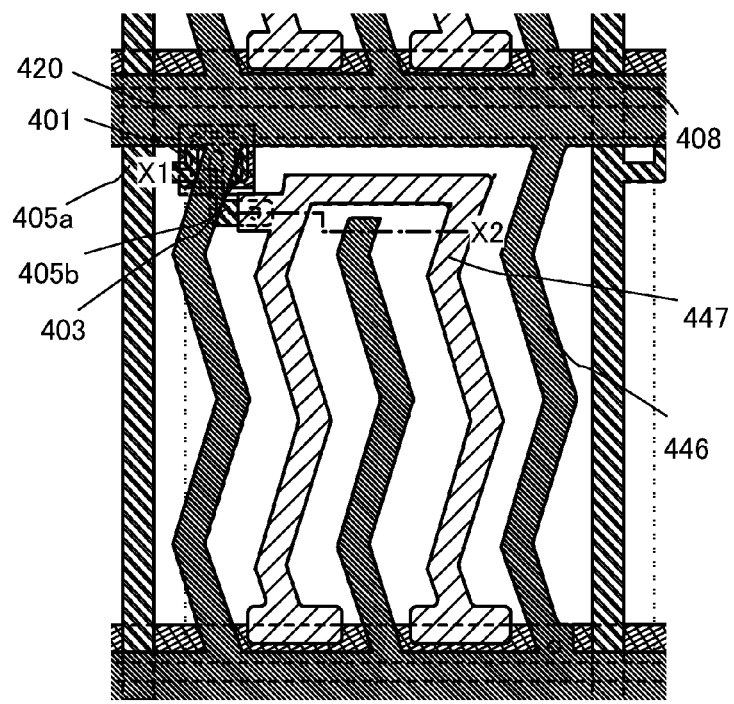
FIGS. 18A and 18B illustrate a liquid crystal display device.

FIG. 18A is a plan view of a liquid crystal display device illustrating one pixel. FIG. 18B is a cross-sectional view taken along line X1-X2 in FIG. 18A.

In FIG. 18A, a plurality of source wiring layers (including a wiring layer 405a) are provided in parallel to each other (extended in a vertical direction in the drawing) and apart from each other. A plurality of gate wiring layers (including a gate electrode layer 401) are provided apart from each other and extend in a direction generally perpendicular to the source wiring layers (a horizontal direction in the drawing). Common wiring layers 408 are provided adjacent to the plurality of gate wiring layers and extend in a direction generally parallel to the gate wiring layers, that is, in a direction generally perpendicular to the source wiring layers (a horizontal direction in the drawing). Roughly rectangular spaces are surrounded by the source wiring layers, the common wiring layers 408, and the gate wiring layers, and a pixel electrode layer and a common wiring layer of a liquid crystal display device are provided in these spaces. A thin film transistor 420 for driving the pixel electrode layer is provided at the upper left corner in the drawing. A plurality of pixel electrode layers and thin film transistors are provided in matrix.

Figure 18B:
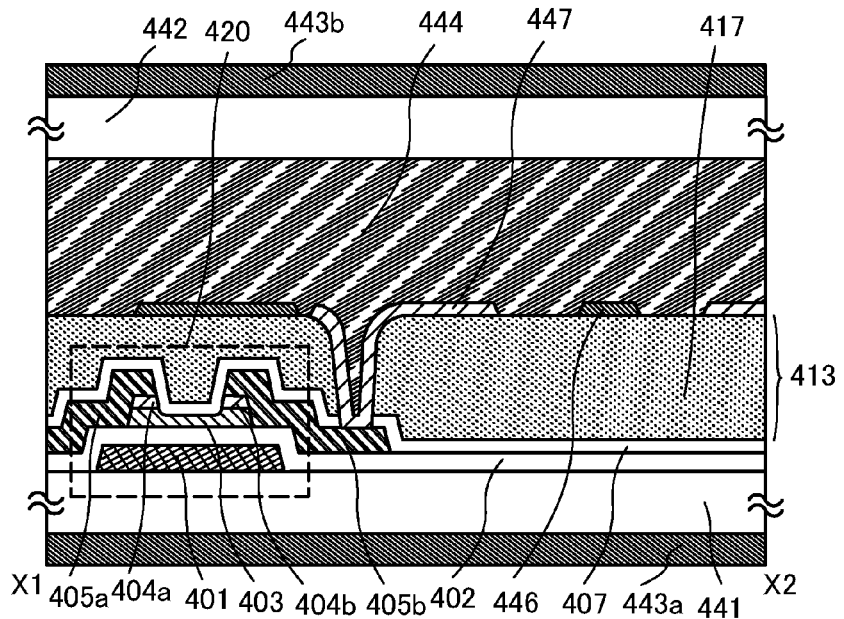

In the liquid crystal display device of FIGS. 18A and 18B, a first electrode layer 447 electrically connected to the thin film transistor 420 serves as a pixel electrode layer and a second electrode layer 446 electrically connected to the common wiring layer 408 serves as a common electrode layer. Note that a capacitor is formed by the first electrode layer and the common wiring layer. Although a common electrode layer can operate in a floating state (an electrically isolated state), the potential of the common electrode layer may be set to a fixed potential, preferably to a potential around a common potential (an intermediate potential of an image signal which is transmitted as data) in such a level as not to generate flickers.

A method in which the gray scale is controlled by generating an electric field generally parallel (i.e., in a lateral direction) to a substrate to move liquid crystal molecules in a plane parallel to the substrate can be used. For such a method, an electrode structure used in IPS mode as illustrated in FIGS. 18A and 18B can be employed.

In a lateral electric field mode such as IPS mode, a first electrode layer (e.g., a pixel electrode layer with which voltage is controlled per pixel) and a second electrode layer (e.g., a common electrode layer with which common voltage is applied to all pixels), which have an opening pattern, are located below a liquid crystal layer. Therefore, the first electrode layer 447 and the second electrode layer 446, one of which is a pixel electrode layer and the other of which is a common electrode layer, are formed over a first substrate 441, and at least one of the first electrode layer and the second electrode layer is formed over an interlayer film. The first electrode layer 447 and the second electrode layer 446 have not a plane shape but various opening patterns including a bent portion or a comb-shaped portion. The first electrode layer 447 and the second electrode layer 446 are arranged so that they do not have the same shape and do not overlap with each other, in order to generate electric field therebetween.

By application of electric field between the pixel electrode layer and the common electrode layer, a liquid crystal is controlled. An electric field in a lateral direction is applied to the liquid crystal, so that liquid crystal molecules can be controlled using the electric field. That is, the liquid crystal molecules oriented parallel to the substrate can be controlled in a direction parallel to the substrate; accordingly, the viewing angle can be widened.

Figure 8A:
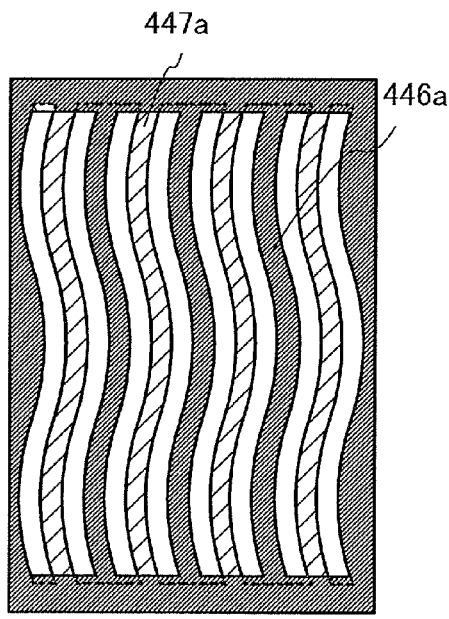
FIGS. 8A to 8D each illustrate an electrode layer of a liquid crystal display device.
Figure 8B:
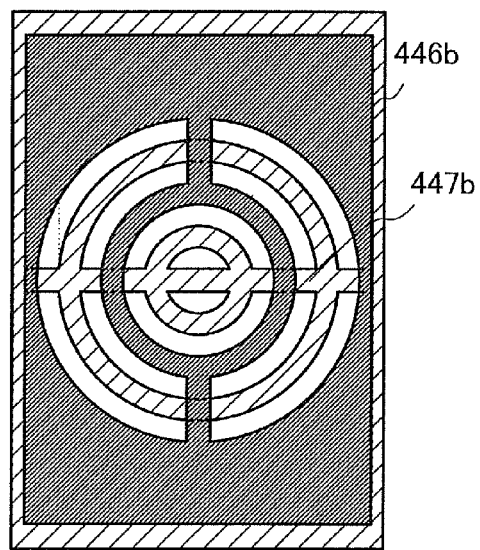
Figure 8C:
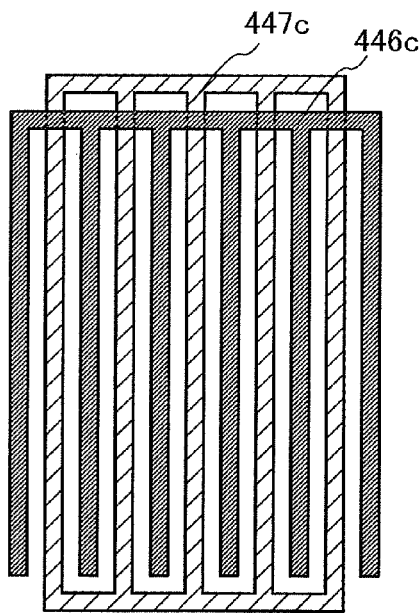
Figure 8D:
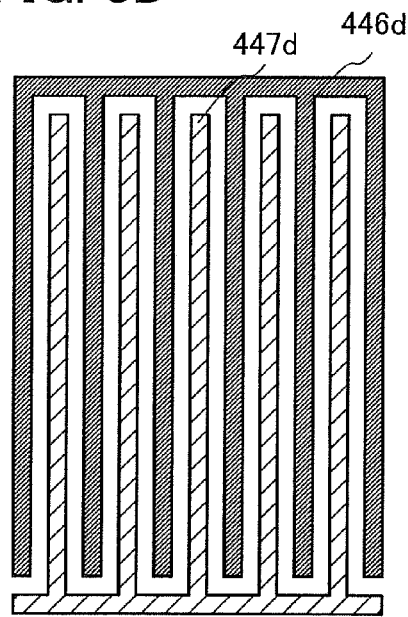

Other examples of the first electrode layer 447 and the second electrode layer 446 are illustrated in FIGS. 8A to 8D. As illustrated in the top views of FIGS. 8A to 8D, first electrode layers 447a to 447d and second electrode layers 446a to 446d are arranged alternately. In FIG. 8A, the first electrode layer 447a and the second electrode layer 446a have a wavelike shape with curves. In FIG. 8B, the first electrode layer 447b and the second electrode layer 446b have a shape with concentric circular openings. In FIG. 8C, the first electrode layer 447c and the second electrode layer 446c have a comb-shape and partially overlap with each other. In FIG. 8D, the first electrode layer 447d and the second electrode layer 446d have a comb-shape in which the electrode layers are engaged with each other. In the case where the first electrode layer 447a, 447b, or 447c overlaps with the second electrode layer 446a, 446b, or 446c as illustrated in FIGS. 8A to 8C, an insulating film is formed between the first electrode layer 447 and the second electrode layer 446 so that the first electrode layer 447 and the second electrode layer 446 are formed over different films.

The thin film transistor 420 is an inverted staggered thin film transistor and includes, over the first substrate 441 having an insulating surface, the gate electrode layer 401, a gate insulating layer 402, a semiconductor layer 403, n⁺ layers 404a and 404b serving as a source region and a drain region, and wiring layers 405a and 405b serving as a source electrode layer and a drain electrode layer.

An insulating film 407 is provided in contact with the semiconductor layer 403 so as to cover the thin film transistor 420. An interlayer film 413 is provided over the insulating film 407, and the first electrode layer 447 and the second electrode layer 446 are formed over the interlayer film 413.

In the interlayer film 413 of the liquid crystal display device of FIGS. 18A and 18B, a light-transmitting chromatic color resin layer 417 is used as a film having a function of attenuating the intensity of transmitting visible light.

When a coloring layer of the light-transmitting chromatic color resin layer 417 is used as the interlayer film 413 provided over the thin film transistor 420, the intensity of incident light on the semiconductor layer 403 of the thin film transistor 420 can be attenuated without reduction in an aperture ratio of a pixel. Accordingly, electric characteristics of the thin film transistor 420 can be prevented from being varied due to photosensitivity of the oxide semiconductor and can be stabilized. Further, the light-transmitting chromatic color resin layer 417 can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

As the light-transmitting chromatic color resin layer, a photosensitive or non-photosensitive organic resin can be used. It is preferable to use a photosensitive organic resin layer because the number of resist masks can be reduced and thus the process can be simplified. In addition, a contact hole formed in the interlayer film can have an opening shape with curvature; accordingly, coverage by a film such as an electrode layer formed in the contact hole can be improved.

The formation method of the interlayer film 413 (the light-transmitting chromatic color resin layer 417) is not particularly limited, and the following method can be employed in accordance with the material: spin coating, dip coating, spray coating, droplet discharging (e.g., ink jetting, screen printing, or offset printing), doctor knife, roll coating, curtain coating, knife coating, or the like.

A liquid crystal layer 444 is provided over the first electrode layer 447 and the second electrode layer 446 and sealed with a second substrate 442 which is a counter substrate.

The first substrate 441 and the second substrate 442 are light-transmitting substrates and are provided with a polarizing plate 443a and a polarizing plate 443b respectively on their outer sides (the sides opposite from the liquid crystal layer 444).

The first electrode layer 447 and the second electrode layer 446 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used to form the first electrode layer 447 and the second electrode layer 446. The pixel electrode formed using the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

An insulating film serving as a base film may be provided between the first substrate 441 and the gate electrode layer 401. The base film functions to prevent diffusion of an impurity element from the first substrate 441 and can be formed using one film or stacked films selected from a silicon nitride film, a silicon oxide film, a silicon nitride oxide film, and a silicon oxynitride film. The gate electrode layer 401 can be formed to have a single-layer structure or a stacked structure using a metal material such as molybdenum, titanium, chromium, tantalum, tungsten, aluminum, copper, neodymium, or scandium or an alloy material which contains any of these materials as its main component. By using a light-blocking conductive film as the gate electrode layer 401, light from a backlight (light emitted through the first substrate 441) can be prevented from entering the semiconductor layer 403.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

The gate insulating layer 402 can be formed to have a single-layer structure or a stacked structure using a silicon oxide layer, a silicon nitride layer, a silicon oxynitride layer, or a silicon nitride oxide layer by a plasma CVD method, a sputtering method, or the like. Alternatively, the gate insulating layer 402 can be formed using a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

It is preferable that reverse sputtering in which an argon gas is introduced to generate plasma be performed before the formation of the oxide semiconductor film used as the semiconductor layer 403 in order to remove dust attached to a surface of the gate insulating layer. Note that instead of an argon atmosphere, a nitrogen atmosphere, a helium atmosphere, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

The semiconductor layer 403 and the $n^+$ layers 404a and 404b serving as a source region and a drain region can be formed using an In—Ga—Zn—O based non-single-crystal film. The $n^+$ layers 404a and 404b are oxide semiconductor layers having a resistance lower than the semiconductor layer 403. For example, the $n^+$ layers 404a and 404b have n-type conductivity and an activation energy ($\Delta E$) of 0.01 to 0.1 eV inclusive. The $n^+$ layers 404a and 404b are In—Ga—Zn—O based non-single-crystal films and include at least an amorphous component. The $n^+$ layers 404a and 404b may include crystal grains (nanocrystals) in an amorphous structure. These crystal grains (nanocrystals) in the $n^+$ layers 404a and 404b each have a diameter of 1 nm to 10 nm, typically about 2 nm to 4 nm.

By the provision of the $n^+$ layers 404a and 404b, the wiring layers 405a and 405b which are metal layers can have a good junction with the semiconductor layer 403 which is an oxide semiconductor layer, so that stable operation can be realized in terms of heat in comparison with a Schottky junction. In addition, willing provision of the $n^+$ layer is effective in supplying carriers to the channel (on the source side), stably absorbing carriers from the channel (on the drain side), or preventing a resistance component from being formed at an interface between the wiring layer and the semiconductor layer. Moreover, since resistance is reduced, good mobility can be ensured even with a high drain voltage.

The first In—Ga—Zn—O based non-single-crystal film used as the semiconductor layer 403 is formed under deposition conditions different from those for the second In—Ga—Zn—O based non-single-crystal film which is used as the $n^+$ layers 404a and 404b. For example, the first In—Ga—Zn—O based non-single-crystal film is formed under conditions where the ratio of an oxygen gas flow rate to argon gas flow rate is higher than the ratio of an oxygen gas flow rate to an argon gas flow rate under the deposition conditions for the second In—Ga—Zn—O based non-single-crystal film. Specifically, the second In—Ga—Zn—O based non-single-crystal film is formed in a rare gas (e.g., argon or helium) atmosphere (or an atmosphere, less than or equal to 10% of which is an oxygen gas and greater than or equal to 90% of which is an argon gas), and the first In—Ga—Zn—O based non-single-crystal film is formed in an oxygen atmosphere (or an atmosphere in which the oxygen gas flow rate is higher than or equal to the argon gas flow rate).

For example, the first In—Ga—Zn—O based non-single-crystal film used as the semiconductor layer 403 is formed in an argon or oxygen atmosphere using an oxide semiconductor target having a diameter of 8 inches and including In, Ga, and Zn ($In_2O_3$:$Ga_2O_3$:ZnO=1:1:1), with the distance between the substrate and the target set to 170 mm, under a pressure of 0.4 Pa, and with a direct-current (DC) power source of 0.5 kW. Note that it is preferable to use a pulsed direct-current (DC) power source, with which dust can be reduced and thickness distribution can be evened. The first In—Ga—Zn—O based non-single-crystal film has a thickness of 5 nm to 200 nm.

On the contrary, the second oxide semiconductor film used as the $n^+$ layers 404a and 404b is formed by a sputtering method, which is performed using a target ($In_2O_3$:$Ga_2O_3$:ZnO=1:1:1) under deposition conditions where the pressure is 0.4 Pa, the power is 500 W, the deposition temperature is room temperature, and an argon gas is introduced at a flow rate of 40 sccm. An In—Ga—Zn—O based non-single-crystal film including crystal grains with a size of 1 nm to 10 nm immediately after the film formation is formed in some cases. Note that it can be said that the presence or absence of crystal grains or the density of crystal grains can be adjusted and the diameter size can be adjusted within the range of 1 nm to 10 nm by appropriate adjustment of the reactive sputtering deposition conditions such as the composition ratio in the target, the film deposition pressure (0.1 Pa to 2.0 Pa), the power (250 W to 3000 W: 8 inches ø), the temperature (room temperature to 100° C.), and the like. The second In—Ga—Zn—O based non-single-crystal film has a thickness of 5 nm to 20 nm. Needless to say, when the film includes crystal grains, the size of the crystal grains does not exceed the thickness of the film. The second In—Ga—Zn—O based non-single-crystal film has a thickness of 5 nm.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

In the manufacturing process of the semiconductor layer, the $n^+$ layers, and the wiring layers, an etching step is used to process thin films into desired shapes. Dry etching or wet etching can be used for the etching step.

As an etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferable.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As an etching apparatus used for dry etching, an etching apparatus that uses reactive ion etching (RIE), or a dry etching apparatus that uses a high-density plasma source such as an electron cyclotron resonance (ECR) source or an inductively coupled plasma (ICP) source can be used. As such a dry etching apparatus with which uniform discharge can be easily obtained over a large area as compared to an ICP etching apparatus, there is an enhanced capacitively coupled plasma (ECCP) mode etching apparatus in which an upper electrode is grounded, a high-frequency power source of 13.56 MHz is connected to a lower electrode, and further a low-frequency power source of 3.2 MHz is connected to the lower electrode. This ECCP mode etching apparatus, if used, can be applied even when a substrate having the size exceeding 3 meters of the tenth generation is used as the substrate, for example.

In order to perform etching to desired shapes, etching conditions (e.g., the amount of electric power applied to a coiled electrode, the amount of electric power applied to an electrode on a substrate side, or the electrode temperature on the substrate side) are controlled as appropriate.

As an etchant used for wet etching, a mixed solution of phosphoric acid, acetic acid, and nitric acid, an ammonia peroxide mixture (hydrogen peroxide:ammonia:water=5:2:2), or the like can be used. Alternatively, ITO-07N (produced by Kanto Chemical Co., Inc.) may be used.

The etchant after the wet etching is removed by cleaning, together with the etched material. The waste liquid of the etchant including the etched material may be purified so that the included material is reused. If a material such as indium included in the oxide semiconductor layer is collected from the waste liquid of the etching and reused, resources can be used effectively and cost can be reduced.

In order to perform etching to desired shapes, etching conditions (e.g., etchant, etching time, temperature, or the like) are controlled as appropriate in accordance with the material.

As a material of the wiring layers 405a and 405b, an element selected from Al, Cr, Ta, Ti, Mo, and W, an alloy containing any of the elements as its component, an alloy containing any of the elements in combination, and the like can be given. Further, in the case of performing heat treatment at 200° C. to 600° C., the conductive film preferably has heat resistance against such heat treatment. Since use of Al alone brings disadvantages such as low resistance and a tendency to corrosion, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of the above elements as a component, an alloy containing any of the above elements in combination, and a nitride containing any of the above elements as a component.

The gate insulating layer 402, the semiconductor layer 403, the $n^+$ layers 404a and 404b, and the wiring layers 405a and 405b may be formed in succession without being exposed to air. By successive formation without exposure to air, each interface between the stacked layers can be formed without being contaminated by atmospheric components or contaminating impurities contained in air; therefore, variation in characteristics of the thin film transistor can be reduced.

Note that the semiconductor layer 403 is partially etched and has a groove (a depression portion).

The semiconductor layer 403 and the $n^+$ layers 404a and 404b are preferably subjected to heat treatment at 200° C. to 600° C., typically 300° C. to 500° C. For example, heat treatment is performed for 1 hour at 350° C. in a nitrogen atmosphere. By this heat treatment, rearrangement at the atomic level is caused in the In—Ga—Zn—O based oxide semiconductor which forms the semiconductor layer 403 and the $n^+$ layers 404a and 404b. This heat treatment (also including photo-annealing or the like) is important in that the distortion that interrupts carrier transfer in the semiconductor layer 403 and the $n^+$ layers 404a and 404b can be reduced. Note that there is no particular limitation on when to perform the heat treatment, as long as it is performed after the semiconductor layer 403 and the $n^+$ layers 404a and 404b are formed.

In addition, oxygen radical treatment may be performed on the exposed depression portion of the semiconductor layer 403. The radical treatment is preferably performed in an atmosphere of $O_2$ or $N_2O$, or an atmosphere of $N_2$, He, Ar, or the like which includes oxygen. Alternatively, an atmosphere obtained by adding $Cl_2$ or $CF_4$ to the above atmosphere may be used. Note that the radical treatment is preferably performed with no bias voltage applied to the first substrate 441 side.

The insulating film 407 covering the thin film transistor 420 can be formed using an inorganic insulating film or organic insulating film formed by a wet method or a dry method. For example, the insulating film 407 can be formed by a CVD method, a sputtering method, or the like using a silicon nitride film, a silicon oxide film, a silicon oxynitride film, an aluminum oxide film, a tantalum oxide film, or the like. Alternatively, an organic material such as acrylic, polyimide, benzocyclobutene, polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like.

Note that a siloxane-based resin is a resin formed using a siloxane-based material as a starting material and having the bond of Si—O—Si. A siloxane-based resin may include, as a substituent, an organic group (e.g., an alkyl group or an aryl group) or a fluoro group. The organic group may include a fluoro group. A siloxane-based resin is applied by a coating method and baked; thus, the insulating film 407 can be formed.

Alternatively, the insulating film 407 may be formed by stacking plural insulating films formed using any of these materials. For example, the insulating film 407 may have such a structure that an organic resin film is stacked over an inorganic insulating film.

Further, by using a resist mask which is formed using a multi-tone mask and has regions with plural thicknesses (typically, two different thicknesses), the number of resist masks can be reduced, resulting in simplified process and lower cost.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

Embodiment 3

In Embodiment 3, examples in which a pixel electrode layer and a common electrode layer are formed in different planes will be described with reference to FIGS. 3A and 3B, FIGS. 4A and 4B, and FIGS. 7A and 7B. Note that components in common with those in Embodiments 1 and 2 can be formed using a similar material and manufacturing method, and detailed description of the same portions and portions having similar functions is omitted.

Figure 3A:
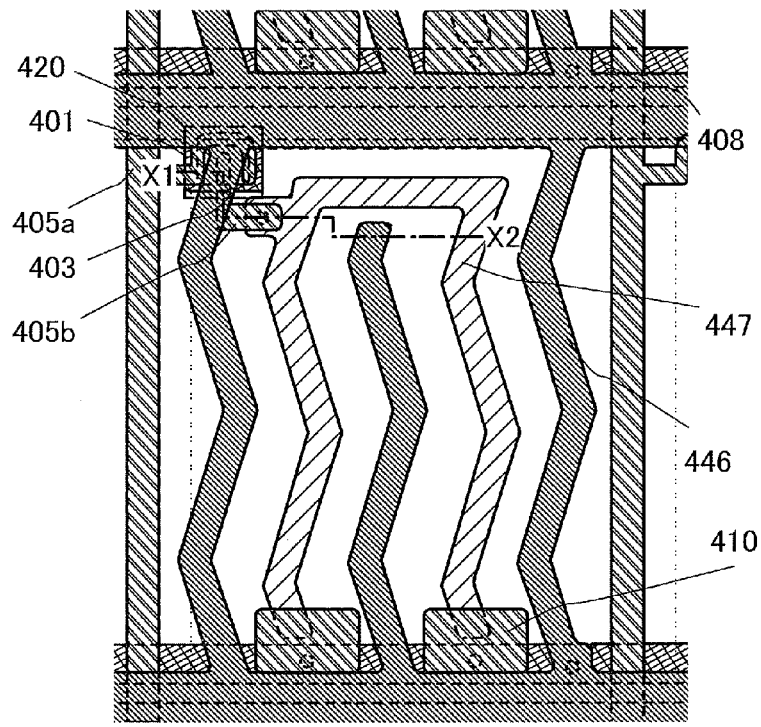
FIGS. 3A and 3B illustrate a liquid crystal display device.
Figure 3B:
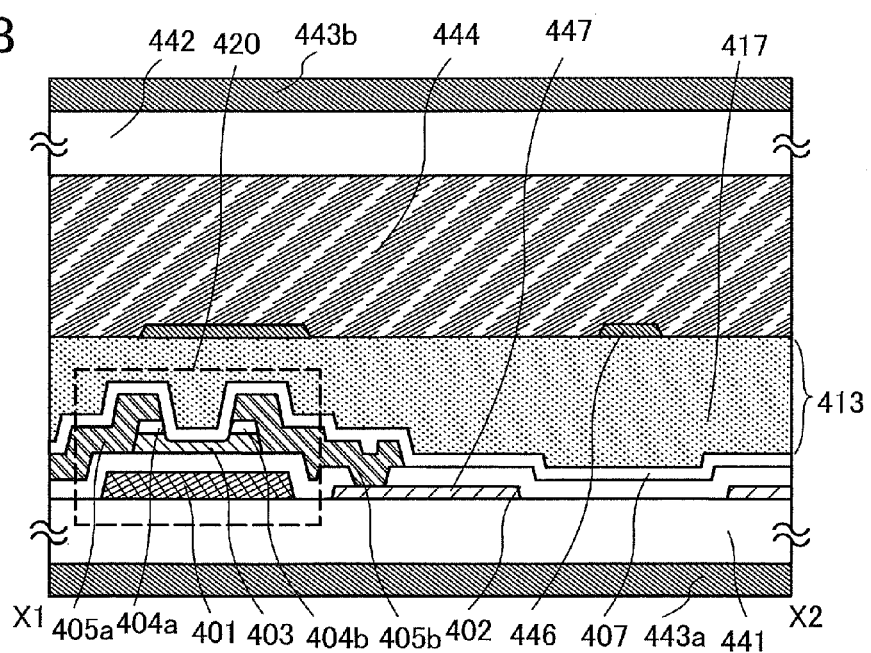
Figure 4A:
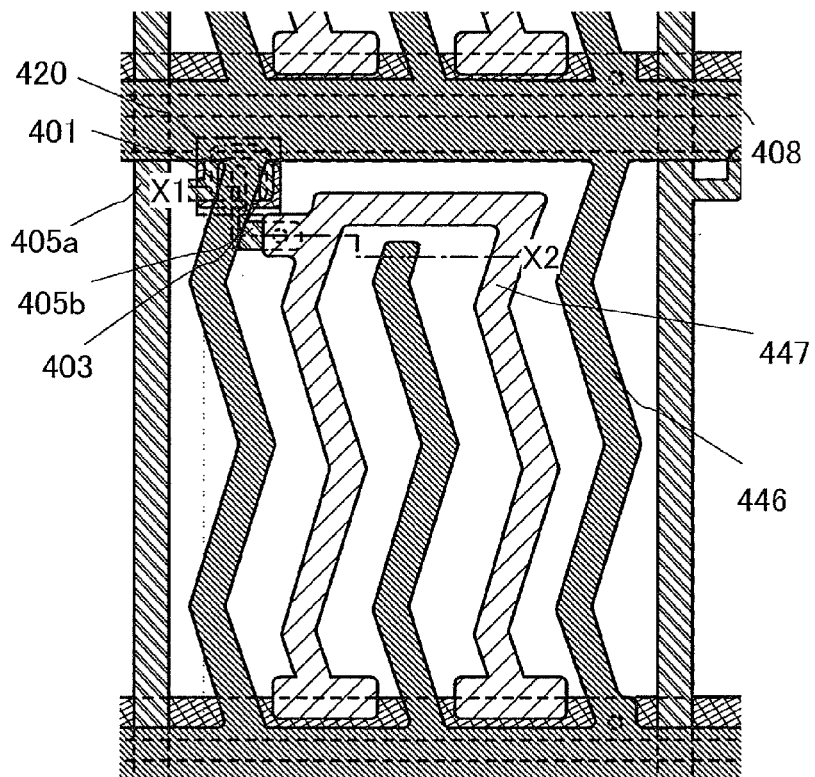
FIGS. 4A and 4B illustrate a liquid crystal display device.
Figure 4B:
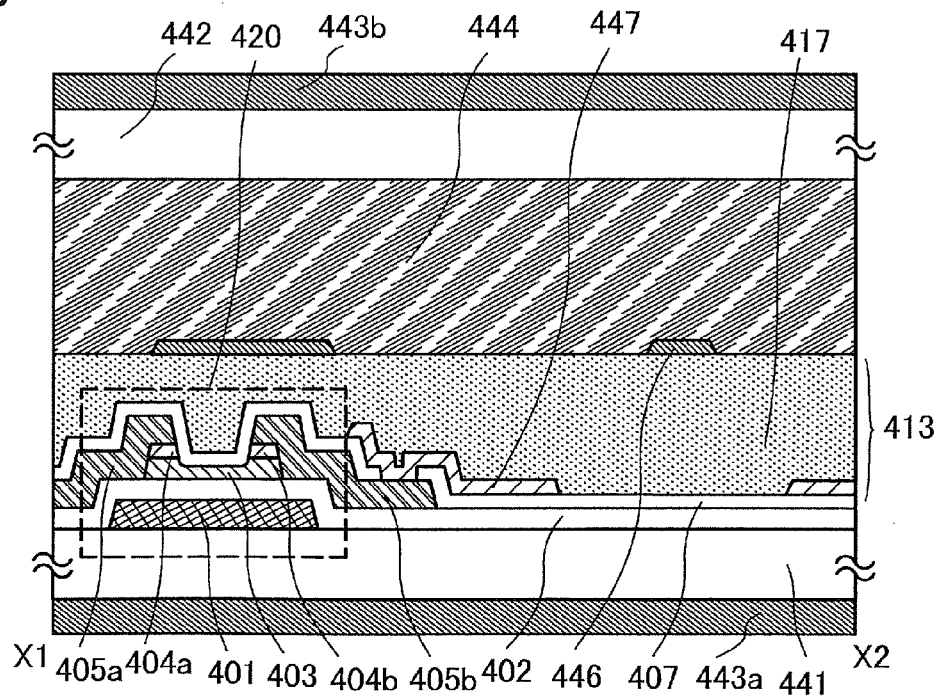
Figure 7A:
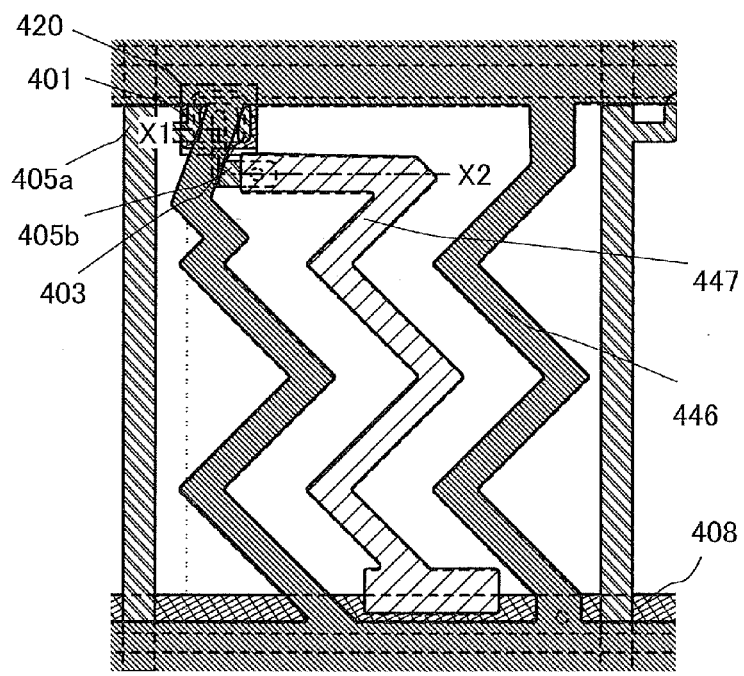
FIGS. 7A and 7B illustrate a liquid crystal display device.
Figure 7B:
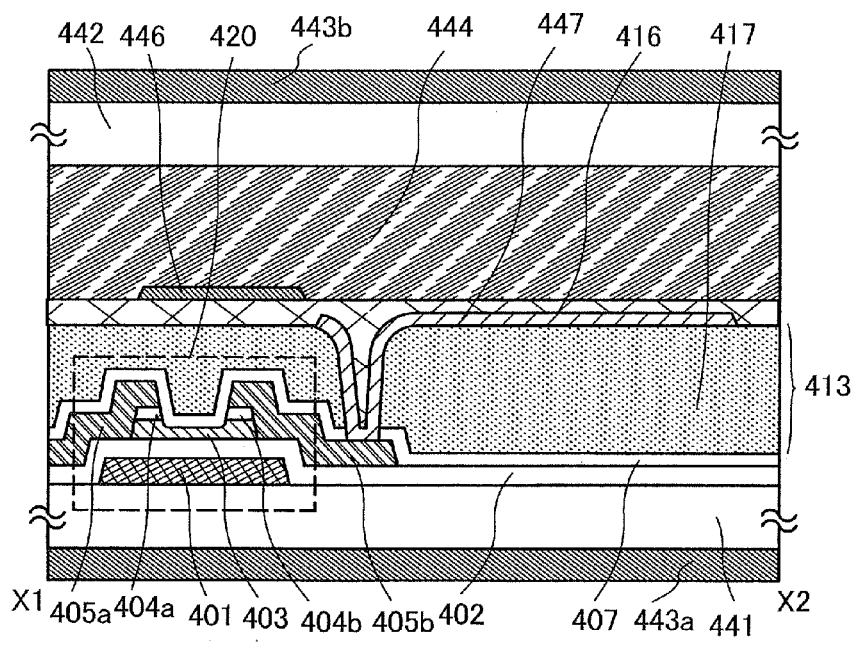

FIG. 3A, FIG. 4A, and FIG. 7A are plan views of liquid crystal display devices, each illustrating one pixel. FIG. 3B, FIG. 4B, and FIG. 7B are cross-sectional views taken along line X1-X2 in FIG. 3A, FIG. 4A, and FIG. 7A, respectively.

In each of the plan views of FIG. 3A, FIG. 4A, and FIG. 7A, in a manner similar to that of Embodiment 2, a plurality of source wiring layers (including a wiring layer 405a) are provided in parallel to each other (extended in a vertical direction in the drawing) and apart from each other. A plurality of gate wiring layers (including a gate electrode layer 401) are provided apart from each other and extend in a direction generally perpendicular to the source wiring layers (a horizontal direction in the drawing). Common wiring layers 408 are provided adjacent to the plurality of gate wiring layers and extend in a direction generally parallel to the gate wiring layers, that is, in a direction generally perpendicular to the source wiring layers (a horizontal direction in the drawing). Roughly rectangular spaces are surrounded by the source wiring layers, the common wiring layers 408, and the gate wiring layers, and a pixel electrode layer and a common wiring layer of a liquid crystal display device are provided in these spaces. A thin film transistor 420 for driving the pixel electrode layer is provided at the upper left corner in the drawing. A plurality of pixel electrode layers and thin film transistors are provided in matrix.

The liquid crystal display devices of FIGS. 3A and 3B, FIGS. 4A and 4B, and FIGS. 7A and 7B are each provided with a first electrode layer 447 which is a pixel electrode layer and a second electrode layer 446 which is a common electrode layer over different films (over different layers) as illustrated in the cross-sectional views of FIG. 3B, FIG. 4B, and FIG. 7B. FIG. 3B, FIG. 4B, and FIG. 7B each illustrate an example in which the first electrode layer 447 which is a pixel electrode layer is formed below the second electrode layer 446 which is a common electrode layer with an insulating film interposed therebetween. However, the second electrode layer 446 which is a common electrode layer may be formed below the first electrode layer 447 which is a pixel electrode layer with an insulating film interposed therebetween.

In each of the liquid crystal display devices of FIG. 3A, FIG. 4A, and FIG. 7A, the first electrode layer 447 which is electrically connected to the thin film transistor 420 serves as a pixel electrode layer, while the second electrode layer 446 which is electrically connected to the common electrode layer 408 serves as a common electrode layer.

In FIGS. 3A and 3B, the first electrode layer 447 is formed over a first substrate 441; a gate insulating layer 402, a wiring layer 405b, an insulating film 407, and an interlayer film 413 are stacked over the first electrode layer 447; and the second electrode layer 446 is formed over the interlayer film 413. In FIGS. 3A and 3B, a capacitor is formed by the first electrode layer 447 and a wiring layer 410 formed in the same step as that of the wiring layers 405a and 405b.

In FIGS. 4A and 4B, the first electrode layer 447 is formed over an insulating film 407; an interlayer film 413 is stacked over the first electrode layer 447; and the second electrode layer 446 is formed over the interlayer film 413. In FIGS. 4A and 4B, a capacitor is formed by the first electrode layer and the common wiring layer.

In FIGS. 7A and 7B, the first electrode layer 447 is formed over an interlayer film 413; an insulating film 416 is stacked over the first electrode layer 447; and the second electrode layer 446 is formed over the insulating film 416. In FIGS. 7A and 7B, a capacitor is formed by the first electrode layer and the common wiring layer. FIGS. 7A and 7B illustrate an example where the first electrode layer 447 and the second electrode layer 446 have a comb-shape in which the angle of a bent portion is 90 degrees. When the angle of the bent portion in the first electrode layer 447 and the second electrode layer 446 is 90 degrees, the angle difference between the polarizing axis of a polarizing plate and the orientation angle of liquid crystal molecules is 45 degrees, and at this time, transmittance in white display can be maximized.

When a coloring layer of a light-transmitting chromatic color resin layer is used as the interlayer film provided over the thin film transistor, the intensity of incident light on a semiconductor layer of the thin film transistor can be attenuated without reduction in an aperture ratio of a pixel. Accordingly, electric characteristics of the thin film transistor can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

Embodiment 4

A liquid crystal display device including a light-blocking layer (a black matrix) will be described with reference to FIGS. 5A and 5B.

Figure 5A:
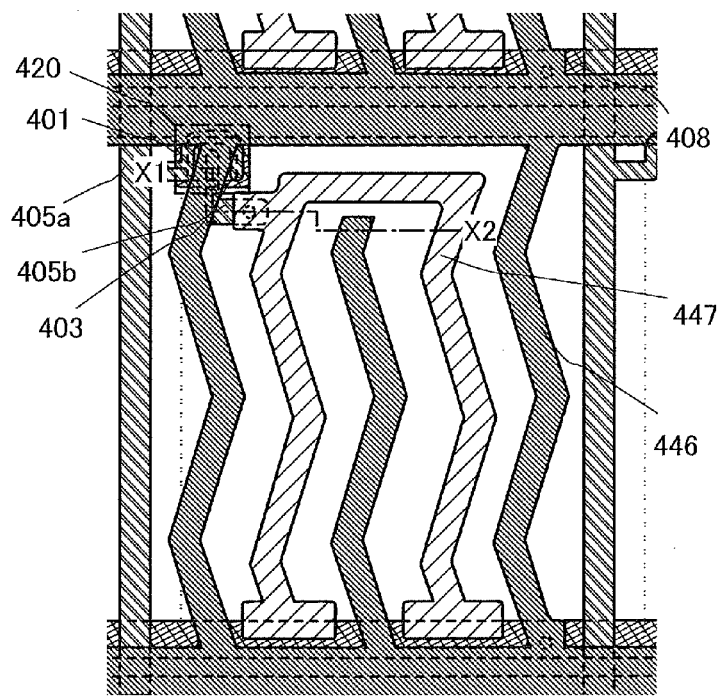
FIGS. 5A and 5B illustrate a liquid crystal display device.
Figure 5B:
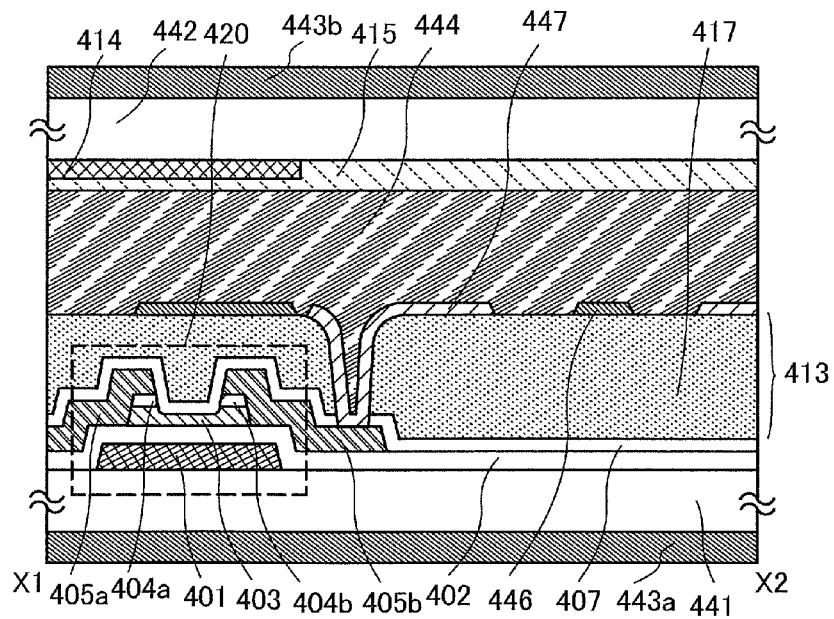

The liquid crystal display device illustrated in FIGS. 5A and 5B is an example in which a light-blocking layer 414 is further formed on the second substrate (the counter substrate) 442 side in the liquid crystal display device illustrated in FIGS. 18A and 18B of Embodiment 2. Therefore, components in common with those in Embodiment 2 can be formed using a similar material and manufacturing method, and detailed description of the same portions and portions having similar functions is omitted.

FIG. 5A is a plan view of the liquid crystal display device, and FIG. 5B is a cross-sectional view taken along line X1-X2 in FIG. 5A. Note that the plan view of FIG. 5A illustrates only the element substrate side and the counter substrate side is not illustrated.

The light-blocking layer 414 is formed on the liquid crystal layer 444 side of the second substrate 442 and an insulating layer 415 is formed as a planarization film. The light-blocking layer 414 is preferably formed in a region corresponding to the thin film transistor 420 with the liquid crystal layer 444 (a region which overlaps with a semiconductor layer of the thin film transistor) interposed therebetween. The first substrate 441 and the second substrate 442 are firmly attached to each other with the liquid crystal layer 444 interposed therebetween so that the light-blocking layer 414 is positioned to cover at least the semiconductor layer 403 of the thin film transistor 420.

The light-blocking layer 414 is formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, aluminum, or the like, for example.

The formation method of the light-blocking layer 414 is not particularly limited, and a dry method such as vapor deposition, sputtering, CVD, or the like or a wet method such as spin coating, dip coating, spray coating, droplet discharging (e.g., ink jetting, screen printing, or offset printing), or the like may be used in accordance with the material. If needed, an etching method (dry etching or wet etching) may be employed to form a desired pattern.

The insulating layer 415 may be formed using an organic resin or the like such as acrylic or polyimide by a coating method such as spin coating or various printing methods.

When the light-blocking layer 414 is further provided on the counter substrate side in this manner, contrast can be increased and the thin film transistor can be stabilized more. The light-blocking layer 414 can block incident light on the semiconductor layer 403 of the thin film transistor 420; accordingly, electric characteristics of the thin film transistor 420 can be prevented from being varied due to photosensitivity of the oxide semiconductor and can be stabilized more. Further, the light-blocking layer 414 can prevent light leakage to an adjacent pixel, which enables higher contrast and higher definition display. Therefore, high definition and high reliability of the liquid crystal display device can be achieved.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 5

A liquid crystal display device including a light-blocking layer (a black matrix) will be described with reference to FIGS. 6A and 6B.

Figure 6A:
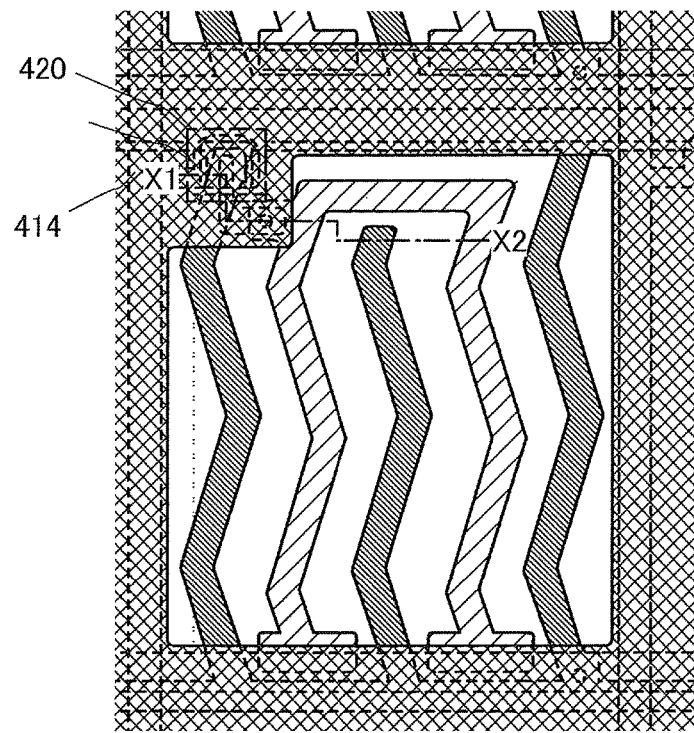
FIGS. 6A and 6B illustrate a liquid crystal display device.
Figure 6B:
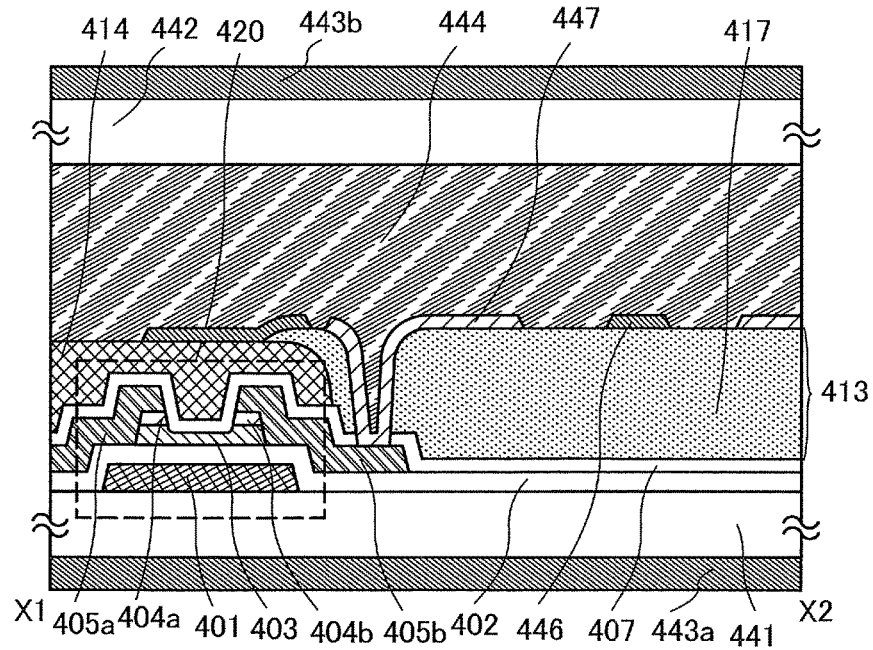

The liquid crystal display device illustrated in FIGS. 6A and 6B is an example in which a light-blocking layer 414 is formed as part of the interlayer film 413 on the first substrate 441 (the element substrate) side in the liquid crystal display device illustrated in FIGS. 18A and 18B of Embodiment 2. Therefore, components in common with those in Embodiment 2 can be formed using a similar material and manufacturing method, and detailed description of the same portions and portions having similar functions is omitted.

FIG. 6A is a plan view of a liquid crystal display device, and FIG. 6B is a cross-sectional view taken along line X1-X2 in FIG. 6A. Note that the plan view of FIG. 6A illustrates only the element substrate side and the counter substrate side is not illustrated.

The interlayer film 413 includes the light-blocking layer 414 and a light-transmitting chromatic color resin layer 417. The light-blocking layer 414 is provided on the first substrate 441 (element substrate) side and formed over the thin film transistor 420 (at least in a region which covers the semiconductor layer of the thin film transistor) with the insulating film 407 interposed therebetween, so that the light-blocking layer 414 serves as a light-blocking layer for the semiconductor layer. On the contrary, the light-transmitting chromatic color resin layer 417 is formed so as to overlap with the first electrode layer 447 and the second electrode layer 446 and serves as a color filter layer. In the liquid crystal display device of FIG. 6B, part of the second electrode layer 446 is formed over the light-blocking layer 414 and the liquid crystal layer 444 is provided over the part of the second electrode layer 446.

Since the light-blocking layer 414 is used in the interlayer film, it is preferable that black organic resin be used for the light-blocking layer 414. For example, a black resin of a pigment material, carbon black, titanium black, or the like may be mixed into a resin material such as photosensitive or non-photosensitive polyimide. As the formation method of the light-blocking layer 414, a wet method such as spin coating, dip coating, spray coating, droplet discharging (e.g., ink jetting, screen printing, or offset printing), or the like may be used in accordance with the material. If needed, an etching method (dry etching or wet etching) may be employed to form a desired pattern.

When the light-blocking layer 414 is provided in this manner, the light-blocking layer 414 can block incident light on the semiconductor layer 403 of the thin film transistor 420 without reduction in an aperture ratio of a pixel; accordingly, electric characteristics of the thin film transistor 420 can be prevented from being varied due to photosensitivity of the oxide semiconductor and can be stabilized more. Further, the light-blocking layer 414 can prevent light leakage to an adjacent pixel, which enables higher contrast and higher definition display. Therefore, high definition and high reliability of the liquid crystal display device can be achieved.

Further, the light-transmitting chromatic color resin layer 417 can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the light-transmitting chromatic color resin layer 417 included in the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 6

Another example of a thin film transistor that can be applied to the liquid crystal display devices in Embodiments 1 to 5 will be described. Note that components in common with those in Embodiments 2 to 5 can be formed using a similar material and manufacturing method, and detailed description of the same portions and portions having similar functions is omitted.

Figure 10A:
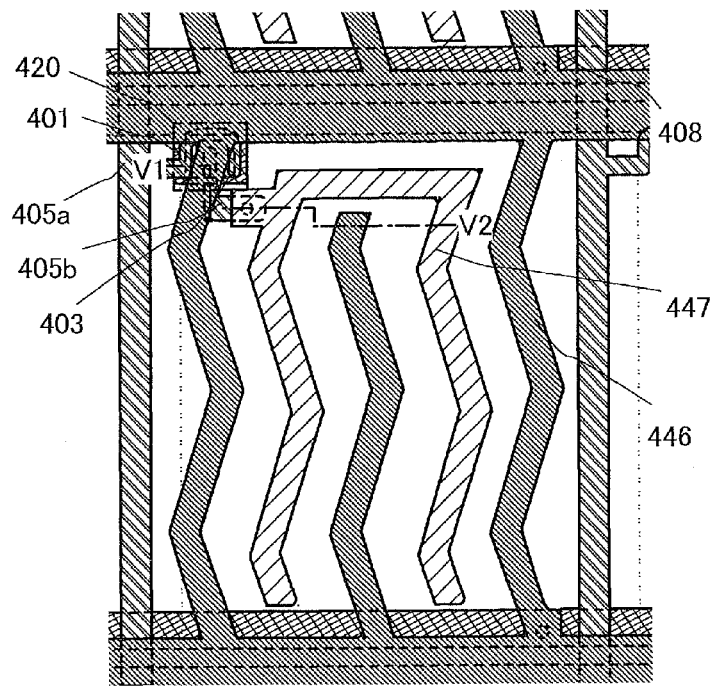
FIGS. 10A and 10B illustrate a liquid crystal display device.
Figure 10B:
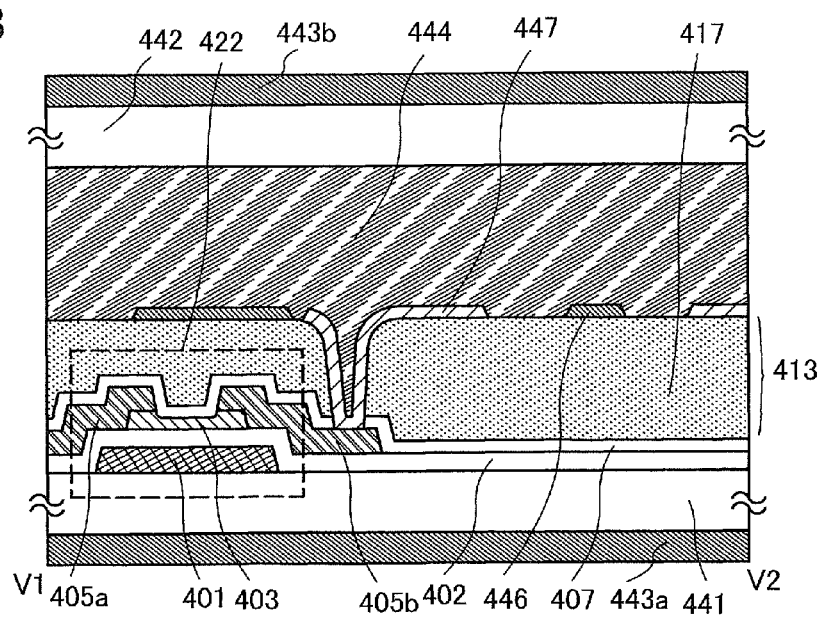

An example of a liquid crystal display device including a thin film transistor which has a structure in which a source electrode layer and a drain electrode layer are in contact with a semiconductor layer without an n+ layer interposed therebetween is illustrated in FIGS. 10A and 10B.

FIG. 10A is a plan view of a liquid crystal display device illustrating one pixel. FIG. 10B is a cross-sectional view taken along line V1-V2 in FIG. 10A.

In the plan view of FIG. 10A, in a manner similar to that of Embodiment 2, a plurality of source wiring layers (including a wiring layer 405a) are provided in parallel to each other (extended in a vertical direction in the drawing) and apart from each other. A plurality of gate wiring layers (including a gate electrode layer 401) are provided apart from each other and extend in a direction generally perpendicular to the source wiring layers (a horizontal direction in the drawing). Common wiring layers 408 are provided adjacent to the plurality of gate wiring layers and extend in a direction generally parallel to the gate wiring layers, that is, in a direction generally perpendicular to the source wiring layers (a horizontal direction in the drawing). Roughly rectangular spaces are surrounded by the source wiring layers, the common wiring layers 408, and the gate wiring layers, and a pixel electrode layer and a common wiring layer of a liquid crystal display device are provided in these spaces. A thin film transistor 422 for driving the pixel electrode layer is provided at the upper left corner in the drawing. A plurality of pixel electrode layers and thin film transistors are provided in matrix.

The first substrate 441 provided with the thin film transistor 422, the interlayer film 413 which is a light-transmitting chromatic color resin layer, the first electrode layer 447, and the second electrode layer 446 and the second substrate 442 are firmly attached to each other with a liquid crystal layer 444 interposed therebetween.

The thin film transistor 422 has a structure in which the semiconductor layer 403 is in contact with the wiring layers 405a and 405b serving as a source electrode layer and a drain electrode layer without an n+ layer interposed therebetween.

When a coloring layer of a light-transmitting chromatic color resin layer is used as the interlayer film provided over the thin film transistor, the intensity of incident light on the semiconductor layer of the thin film transistor can be attenuated without reduction in an aperture ratio of a pixel. Accordingly, electric characteristics of the thin film transistor can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Improvement in contrast and viewing angle characteristics and higher response speed enable a liquid crystal display device with higher image quality and higher performance to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 7

Another example of a thin film transistor that can be applied to the liquid crystal display devices in Embodiments 1 to 5 will be described with reference to FIGS. 9A and 9B.

Figure 9A:
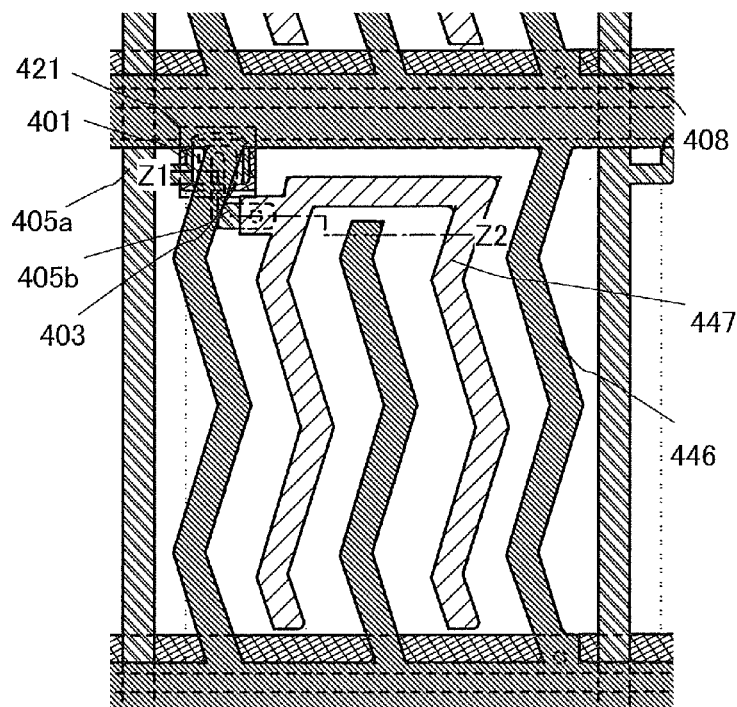
FIGS. 9A and 9B illustrate a liquid crystal display device.
Figure 9B:
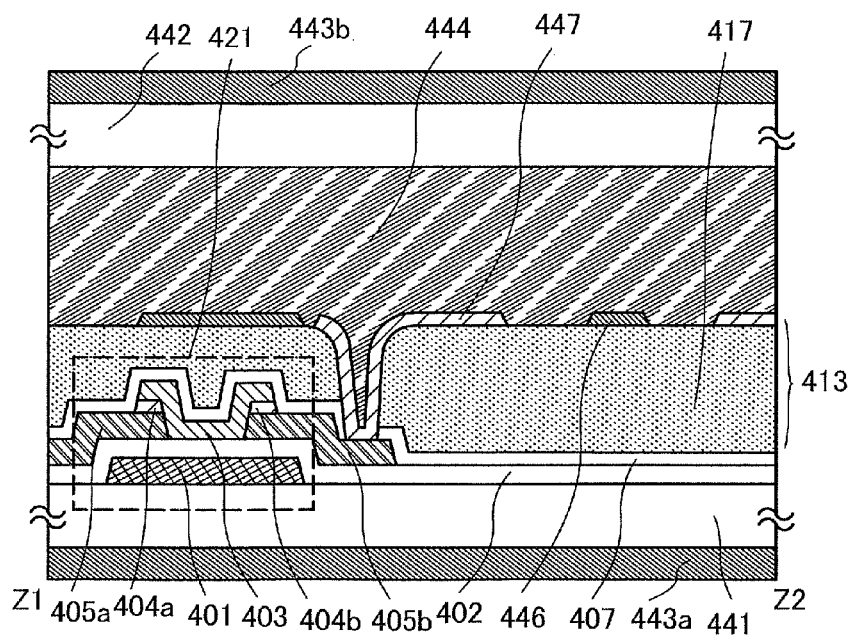

FIG. 9A is a plan view of a liquid crystal display device illustrating one pixel. FIG. 9B is a cross-sectional view taken along line Z1-Z2 in FIG. 9A.

In the plan view of FIG. 9A, in a manner similar to that of Embodiment 2, a plurality of source wiring layers (including a wiring layer 405a) are provided in parallel to each other (extended in a vertical direction in the drawing) and apart from each other. A plurality of gate wiring layers (including a gate electrode layer 401) are provided apart from each other and extend in a direction generally perpendicular to the source wiring layers (a horizontal direction in the drawing). Common wiring layers 408 are provided adjacent to the plurality of gate wiring layers and extend in a direction generally parallel to the gate wiring layers, that is, in a direction generally perpendicular to the source wiring layers (a horizontal direction in the drawing). Roughly rectangular spaces are surrounded by the source wiring layers, the common wiring layers 408, and the gate wiring layers, and a pixel electrode layer and a common wiring layer of a liquid crystal display device are provided in these spaces. A thin film transistor 421 for driving the pixel electrode layer is provided at the upper left corner in the drawing. A plurality of pixel electrode layers and thin film transistors are provided in matrix.

The first substrate 441 provided with the thin film transistor 421, the interlayer film 413 which is a light-transmitting chromatic color resin layer, the first electrode layer 447, and a second electrode layer 446 and the second substrate 442 are firmly attached to each other with the liquid crystal layer 444 interposed therebetween.

The thin film transistor 421 is a bottom-gate thin film transistor and includes, over the first substrate 441 that is a substrate having an insulating surface, the gate electrode layer 401, the gate insulating layer 402, the wiring layers 405a and 405b serving as a source electrode layer and a drain electrode layer, the n⁺ layers 404a and 404b serving as a source region and a drain region, and the semiconductor layer 403. In addition, the insulating film 407 which covers the thin film transistor 421 and is in contact with the semiconductor layer 403 is provided. An In—Ga—Zn—O based non-single-crystal film is used for the semiconductor layer 403 and the n⁺ layers 404a and 404b. The thin film transistor 421 having such a structure shows characteristics of a mobility of 20 cm²/Vs or more and a subthreshold swing (S value) of 0.4 V/dec or less. Thus, the thin film transistor can operate at high speed, and a driver circuit (a source driver or a gate driver) such as a shift register can be formed over the same substrate as the pixel portion.

It is preferable that reverse sputtering in which an argon gas is introduced to generate plasma be performed on the gate insulating layer 402 and the wiring layers 405a and 405b before the formation of the semiconductor layer 403 by a sputtering method, in order to remove dust attached to surfaces.

The semiconductor layer 403 and the n⁺ layers 404a and 404b are preferably subjected to heat treatment at 200° C. to 600° C., typically 300° C. to 500° C. For example, heat treatment is performed for 1 hour at 350° C. in a nitrogen atmosphere. There is no particular limitation on when to perform this heat treatment, as long as it is performed after the oxide semiconductor films used for the semiconductor layer 403 and the n⁺ layers 404a and 404b are formed.

In addition, oxygen radical treatment may be performed on the semiconductor layer 403.

The gate insulating layer 402 exists in the entire region including the thin film transistor 421, and the thin film transistor 421 is provided with the gate electrode layer 401 between the gate insulating layer 402 and the first substrate 441 which is a substrate having an insulating surface. The wiring layers 405a and 405b and the n⁺ layers 404a and 404b are provided over the gate insulating layer 402. In addition, the semiconductor layer 403 is provided over the gate insulating layer 402, the wiring layers 405a and 405b, and the n⁺ layers 404a and 404b. Although not illustrated, a wiring layer is provided over the gate insulating layer 402 in addition to the wiring layers 405a and 405b and the wiring layer extends beyond the perimeter of the semiconductor layer 403 to the outside.

When a coloring layer of a light-transmitting chromatic color resin layer is used as the interlayer film provided over the thin film transistor, the intensity of incident light on the semiconductor layer of the thin film transistor can be attenuated without reduction in an aperture ratio of a pixel. Accordingly, electric characteristics of the thin film transistor can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 8

Another example of a thin film transistor that can be applied to the liquid crystal display devices in Embodiments 1 to 5 will be described. Note that components in common with those in Embodiments 2 to 5 can be formed using a similar material and manufacturing method, and detailed description of the same portions and portions having similar functions is omitted.

Figure 11A:
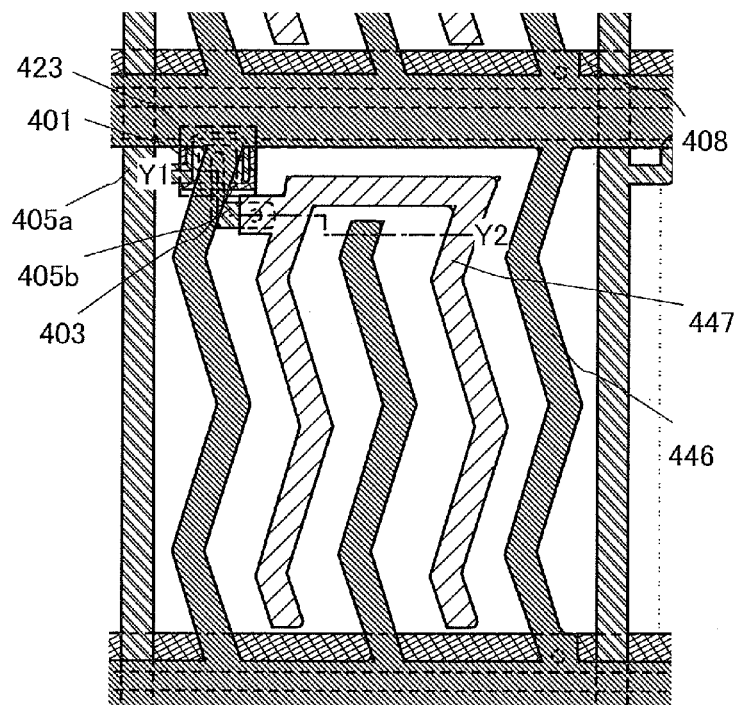
FIGS. 11A and 11B illustrate a liquid crystal display device.
Figure 11B:
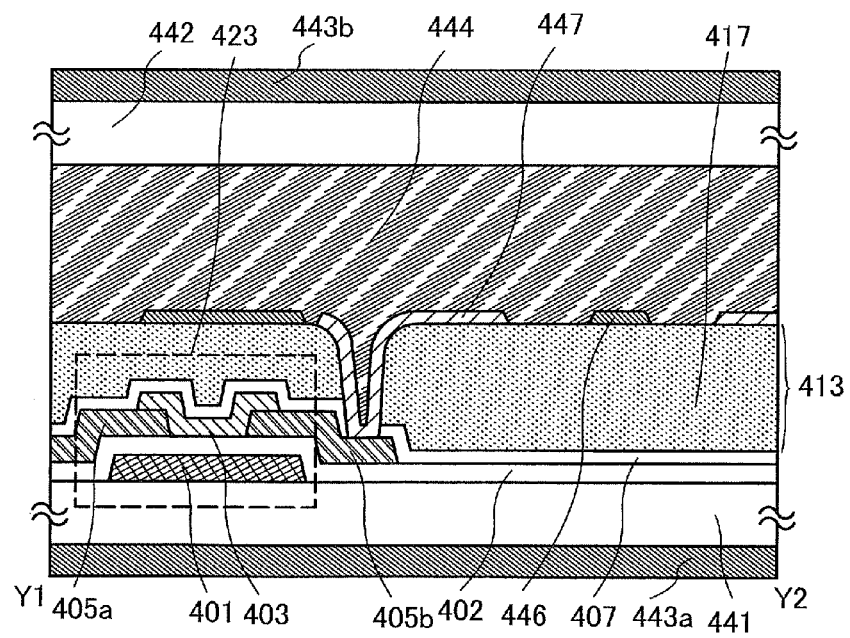

An example of a liquid crystal display device including a thin film transistor which has a structure in which a source electrode layer and a drain electrode layer are in contact with a semiconductor layer without an n⁺ layer interposed therebetween is illustrated in FIGS. 11A and 11B.

FIG. 11A is a plan view of a liquid crystal display device illustrating one pixel. FIG. 11B is a cross-sectional view taken along line Y1-Y2 in FIG. 11A.

In the plan view of FIG. 11A, in a manner similar to that of Embodiment 2, a plurality of source wiring layers (including a wiring layer 405a) are provided in parallel to each other (extended in a vertical direction in the drawing) and apart from each other. A plurality of gate wiring layers (including a gate electrode layer 401) are provided apart from each other and extend in a direction generally perpendicular to the source wiring layers (a horizontal direction in the drawing). Common wiring layers 408 are provided adjacent to the plurality of gate wiring layers and extend in a direction generally parallel to the gate wiring layers, that is, in a direction generally perpendicular to the source wiring layers (a horizontal direction in the drawing). Roughly rectangular spaces are surrounded by the source wiring layers, the common wiring layers 408, and the gate wiring layers, and a pixel electrode layer and a common wiring layer of a liquid crystal display device are provided in these spaces. A thin film transistor 423 for driving the pixel electrode layer is provided at the upper left corner in the drawing. A plurality of pixel electrode layers and thin film transistors are provided in matrix.

The first substrate 441 provided with the thin film transistor 423, the interlayer film 413 which is a light-transmitting chromatic color resin layer, the first electrode layer 447, and the second electrode layer 446 and the second substrate 442 are firmly attached to each other with the liquid crystal layer 444 interposed therebetween.

The gate insulating layer 402 exists in the entire region including the thin film transistor 423, and the thin film transistor 423 is provided with the gate electrode layer 401 between the gate insulating layer 402 and the first substrate 441 which is a substrate having an insulating surface. The wiring layers 405a and 405b are provided over the gate insulating layer 402. In addition, the semiconductor layer 403 is provided over the gate insulating layer 402 and the wiring layers 405a and 405b. Although not illustrated, a wiring layer is provided over the gate insulating layer 402 in addition to the wiring layers 405a and 405b and the wiring layer extends beyond the perimeter of the semiconductor layer 403 to the outside.

When a coloring layer of a light-transmitting chromatic color resin layer is used as the interlayer film provided over the thin film transistor, the intensity of incident light on the semiconductor layer of the thin film transistor can be attenuated without reduction in an aperture ratio of a pixel. Accordingly, electric characteristics of the thin film transistor can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

Improvement in contrast and viewing angle characteristics enables a liquid crystal display device with higher image quality to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 9

A liquid crystal material which exhibits a blue phase can be used for the liquid crystal layers in the above-described Embodiments. A liquid crystal display device that uses a liquid crystal layer exhibiting a blue phase will be described with reference to FIGS. 19A to 19D.

FIGS. 19A to 19D are cross-sectional views of the liquid crystal display device and its manufacturing process.

Figure 19A:
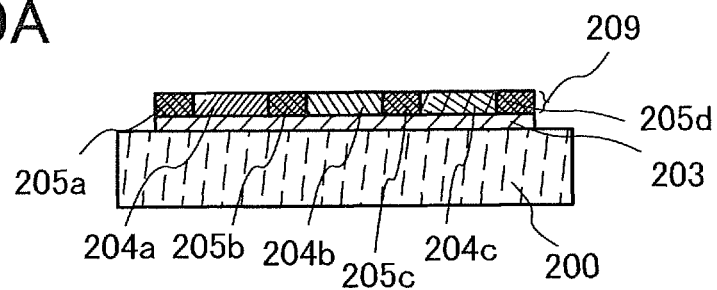
FIGS. 19A to 19D illustrate a manufacturing method of a liquid crystal display device.

In FIG. 19A, the element layer 203 is formed over the first substrate 200 which is an element substrate, and the interlayer film 209 is formed over the element layer 203.

The interlayer film 209 includes the light-transmitting chromatic color resin layers 204a, 204b, and 204c and the light-blocking layers 205a, 205b, 205c, and 205d. The light-blocking layers 205a, 205b, 205c, and 205d are formed at boundaries of the light-transmitting chromatic color resin layers 204a, 204b, and 204c. Note that the pixel electrode layer and the common electrode layer are omitted in FIGS. 19A to 19D. For example, the pixel electrode layer and the common electrode layer can have any of the structures described in Embodiments 2 to 8, and a lateral electric field mode can be employed.

Figure 19B:
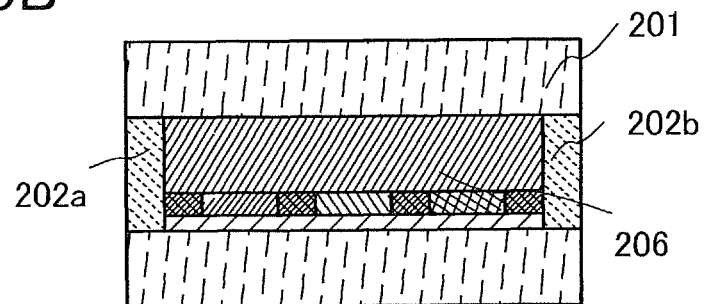

As illustrated in FIG. 19B, the first substrate 200 and the second substrate 201 which is a counter substrate are firmly fixed to each other with the sealants 202a and 202b with a liquid crystal layer 206 interposed therebetween. As a method for forming the liquid crystal layer 206, a dispenser method (a dropping method) or an injection method in which after attachment of the first substrate 200 and the second substrate 201, a liquid crystal is injected with the use of capillary phenomenon can be used.

A liquid crystal material exhibiting a blue phase can be used for the liquid crystal layer 206. The liquid crystal material exhibiting a blue phase has a short response time of 1 msec or less and enables high-speed response, whereby the liquid crystal display device can show higher performance.

The liquid crystal material exhibiting a blue phase includes a liquid crystal and a chiral agent. The chiral agent is employed to align the liquid crystal in a helical structure and to make the liquid crystal to exhibit a blue phase. For example, a liquid crystal material into which a chiral agent is mixed at 5 wt % or more may be used for the liquid crystal layer.

As the liquid crystal, a thermotropic liquid crystal, a low-molecular liquid crystal, a high-molecular liquid crystal, a ferroelectric liquid crystal, an anti-ferroelectric liquid crystal, or the like is used.

As the chiral agent, a material having a high compatibility with a liquid crystal and a strong twisting power is used. Either one of two enantiomers, R and S, is used, and a racemic mixture in which R and S are mixed at 50:50 is not used.

The above liquid crystal material exhibits a cholesteric phase, a cholesteric blue phase, a smectic phase, a smectic blue phase, a cubic phase, a chiral nematic phase, an isotropic phase, or the like depending on conditions.

A cholesteric blue phase and a smectic blue phase, which are blue phases, are seen in a liquid crystal material having a cholesteric phase or a smectic phase with a relatively short helical pitch of less than or equal to 500 nm. The alignment of the liquid crystal material has a double twist structure. Having the order of less than or equal to an optical wavelength, the liquid crystal material is transparent, and optical modulation action is generated through a change in alignment order by voltage application. A blue phase is optically isotropic and thus has no viewing angle dependence. Thus, an alignment film is not necessarily formed; therefore, display image quality can be improved and cost can be reduced. In addition, rubbing treatment on an alignment film is unnecessary; accordingly, electrostatic discharge damage caused by the rubbing treatment can be prevented and defects and damage of the liquid crystal display device can be reduced in the manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

The blue phase appears only within a narrow temperature range; therefore, it is preferable that a photocurable resin and a photopolymerization initiator be added to a liquid crystal material and polymer stabilization treatment be performed in order to widen the temperature range. The polymer stabilization treatment is performed in such a manner that a liquid crystal material including a liquid crystal, a chiral agent, a photocurable resin, and a photopolymerization initiator is irradiated with light having a wavelength with which the photocurable resin and the photopolymerization initiator are reacted. This polymer stabilization treatment may be performed by irradiating a liquid crystal material exhibiting an isotropic phase with light or by irradiating a liquid crystal material exhibiting a blue phase under the control of the temperature with light. For example, the polymer stabilization treatment is performed in the following manner: the temperature of a liquid crystal layer is controlled and under the state in which the blue phase is exhibited, the liquid crystal layer is irradiated with light. However, the polymer stabilization treatment is not limited to this manner and may be performed in such a manner that a liquid crystal layer under the state of exhibiting an isotropic phase at a temperature within +10° C., preferably +5° C. of the phase transition temperature between the blue phase and the isotropic phase is irradiated with light. The phase transition temperature between the blue phase and the isotropic phase is a temperature at which the phase changes from the blue phase to the isotropic phase when the temperature rises, or a temperature at which the phase changes from the isotropic phase to the blue phase when the temperature decreases. As an example of the polymer stabilization treatment, the following method can be employed: after heating a liquid crystal layer to the isotropic phase, the temperature of the liquid crystal layer is gradually decreased so that the phase changes to the blue phase, and then, irradiation with light is performed while the temperature at which the blue phase is exhibited is kept. Alternatively, after the phase changes to the isotropic phase by gradually heating a liquid crystal layer, the liquid crystal layer can be irradiated with light under a temperature within +10° C., preferably +5° C. of the phase transition temperature between the blue phase and the isotropic phase (under the state of exhibiting an isotropic phase). In the case of using an ultraviolet curable resin (a UV curable resin) as the photocurable resin included in the liquid crystal material, the liquid crystal layer may be irradiated with ultraviolet rays. Even in the case where the blue phase is not exhibited, if polymer stabilization treatment is performed by irradiation with light under a temperature within +10° C., preferably +5° C. of the phase transition temperature between the blue phase and the isotropic phase (under the state of exhibiting an isotropic phase), the response time can be made as short as 1 msec or less and high-speed response is possible.

The photocurable resin may be a monofunctional monomer such as acrylate or methacrylate; a polyfunctional monomer such as diacrylate, triacrylate, dimethacrylate, or trimethacrylate; or a mixture thereof. Further, the photocurable resin may have liquid crystallinity, non-liquid crystallinity, or both of them. A resin which is cured with light having a wavelength with which the photopolymerization initiator to be used is reacted may be selected as the photocurable resin, and an ultraviolet curable resin can be typically used.

As the photopolymerization initiator, a radical polymerization initiator which generates radicals by light irradiation, an acid generator which generates an acid by light irradiation, or a base generator which generates a base by light irradiation may be used.

Specifically, a mixture of JC-1041 XX (produced by Chisso Corporation) and 4-cyano-4'-pentylbiphenyl can be used as the liquid crystal material. ZLI-4572 (produced by Merck Ltd., Japan) can be used as the chiral agent. As the photocurable resin, 2-ethylhexyl acrylate, RM257 (produced by Merck Ltd., Japan), or trimethylolpropane triacrylate can be used. As the photopolymerization initiator, 2,2-dimethoxy-2-phenylacetophenone can be used.

The liquid crystal layer 206 is formed using a liquid crystal material including a liquid crystal, a chiral agent, a photocurable resin, and a photopolymerization initiator.

Figure 19C:
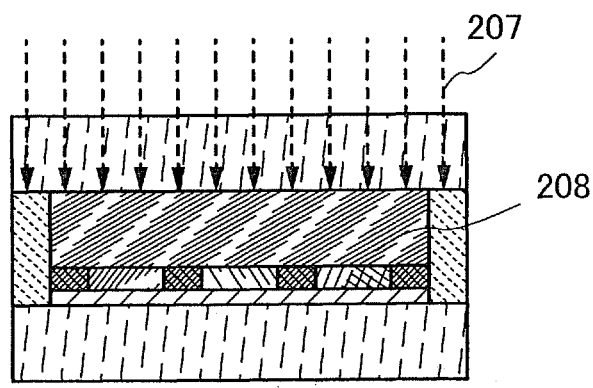

As illustrated in FIG. 19C, polymer stabilization treatment is performed on the liquid crystal layer 206 by irradiation with light 207, so that a liquid crystal layer 208 is formed. The light 207 is light having a wavelength with which the photocurable resin and the photopolymerization initiator included in the liquid crystal layer 206 are reacted. By this polymer stabilization treatment using light irradiation, the temperature range in which the liquid crystal layer 208 exhibits a blue phase can be widened.

In the case where a photocurable resin such as an ultraviolet curable resin is used as a sealant and a liquid crystal layer is formed by a dropping method, for example, the sealant may be cured by the light irradiation step of the polymer stabilization treatment.

When a liquid crystal display device has a structure in which a color filter layer and a light-blocking layer are formed over an element substrate as illustrated in FIGS. 19A to 19D, irradiation light from the counter substrate side is not absorbed or blocked by the color filter layer and the light-blocking layer; accordingly, the entire region of the liquid crystal layer can be uniformly irradiated with the light. Thus, alignment disorder of a liquid crystal due to nonuniform photopolymerization, display unevenness due to the alignment disorder, and the like can be prevented. In addition, since a thin film transistor is shielded from light by the light-blocking layer, electric characteristics of the thin film transistor remains stable.

Figure 19D:
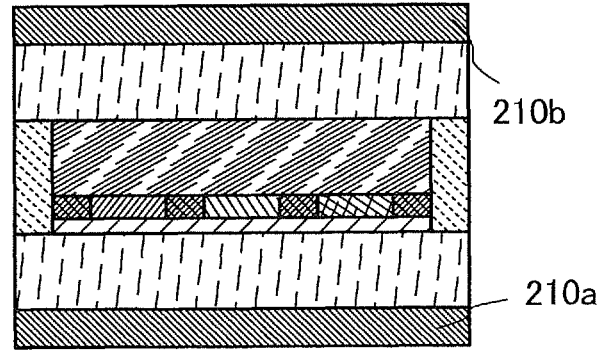

As illustrated in FIG. 19D, a polarizing plate 210a is provided on the outer side (a side opposite from the liquid crystal layer 208) of the first substrate 200 and a polarizing plate 210b is provided on the outer side (a side opposite from the liquid crystal layer 208) of the second substrate 201. In addition to the polarizing plates, an optical film such as a retardation plate or an anti-reflection film may be provided. For example, circular polarization may be employed using a polarizing plate or a retardation plate. Through the above-described process, a liquid crystal display device can be completed.

In the case of manufacturing a plurality of liquid crystal display devices using a large-sized substrate (a so-called multiple panel method), a division step can be performed before the polymer stabilization treatment or before provision of the polarizing plates. In consideration of the influence of the division step on the liquid crystal layer (such as alignment disorder due to force applied in the division step), it is preferable that the division step be performed after the attachment between the first substrate and the second substrate and before the polymer stabilization treatment.

Although not illustrated, a backlight, a sidelight, or the like may be used as a light source. Light from the light source is emitted from the side of the first substrate 200, which is an element substrate, so as to pass through the second substrate 201 on the viewer side.

Improvement in contrast and viewing angle characteristics and higher response speed enable a liquid crystal display device with higher image quality and higher performance to be supplied. Further, such a liquid crystal display device can be manufactured at low cost with high productivity.

Characteristics of the thin film transistor are stabilized and the liquid crystal display device can have higher reliability.

This embodiment can be implemented in combination with any of the structures disclosed in other embodiments as appropriate.

Embodiment 10

A thin film transistor is manufactured, and a liquid crystal display device having a display function can be manufactured using the thin film transistor in a pixel portion and further in a driver circuit. Further, part or whole of a driver circuit can be formed over the same substrate as a pixel portion, using a thin film transistor, whereby a system-on-panel can be obtained.

The liquid crystal display device includes a liquid crystal element (also referred to as a liquid crystal display element) as a display element.

Further, a liquid crystal display device includes a panel in which a display element is sealed, and a module in which an IC or the like including a controller is mounted to the panel. The present invention further relates to one mode of an element substrate before the display element is completed in a manufacturing process of the liquid crystal display device, and the element substrate is provided with a means to supply current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a liquid crystal display device in this specification means an image display device, a display device, or a light source (including a lighting device). Further, the liquid crystal display device includes any of the following modules in its category: a module to which a connector such as an FPC (flexible printed circuit), TAB (tape automated bonding) tape, or a TCP (tape carrier package) is attached; a module having a TAB tape or a TCP at the tip of which a printed wiring board is provided; and a module in which an integrated circuit (IC) is directly mounted on a display element by chip on glass (COG).

The appearance and a cross section of a liquid crystal display panel, which is one embodiment of a liquid crystal display device, will be described with reference to FIGS. 12A1, 12A2, and 12B. FIGS. 12A1 and 12A2 are top views of a panel in which highly reliable thin film transistors 4010 and 4011 each including an oxide semiconductor film as a semiconductor layer and a liquid crystal element 4013 are sealed between a first substrate 4001 and a second substrate 4006 with a sealant 4005. FIG. 12B is a cross-sectional view taken along line M-N of FIGS. 12A1 and 12A2.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006.

In FIG. 12A1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001. On the contrary, FIG. 12A2 illustrates an example in which part of a signal line driver circuit is formed over the first substrate 4001 with the use of a thin film transistor that uses an oxide semiconductor. A signal line driver circuit 4003b is formed over the first substrate 4001 and a signal line driver circuit 4003a that is formed using a single crystal semiconductor film or a polycrystalline semiconductor film is mounted on the substrate separately prepared.

Note that there is no particular limitation on the connection method of a driver circuit which is separately formed, and a COG method, a wire bonding method, a TAB method, or the like can be used. FIG. 12A1 illustrates an example of mounting the signal line driver circuit 4003 by a COG method, and FIG. 12A2 illustrates an example of mounting the signal line driver circuit 4003 by a TAB method.

The pixel portion 4002 and the scanning line driver circuit 4004 provided over the first substrate 4001 include a plurality of thin film transistors. FIG. 12B illustrates the thin film transistor 4010 included in the pixel portion 4002 and the thin film transistor 4011 included in the scanning line driver circuit 4004. An insulating layer 4020 and an interlayer film 4021 are provided over the thin film transistors 4010 and 4011.

Any of the highly reliable thin film transistors including an oxide semiconductor film as a semiconductor layer, which are described in Embodiments 1 to 8, can be used as the thin film transistors 4010 and 4011. The thin film transistors 4010 and 4011 are n-channel thin film transistors.

A pixel electrode layer 4030 and a common electrode layer 4031 are provided over the first substrate 4001, and the pixel electrode layer 4030 is electrically connected to the thin film transistor 4010. The liquid crystal element 4013 includes the pixel electrode layer 4030, the common electrode layer 4031, and the liquid crystal layer 4008. Note that a polarizing plate 4032 and a polarizing plate 4033 are provided on the outer sides of the first substrate 4001 and the second substrate 4006, respectively. The pixel electrode layer 4030 and the common electrode layer 4031 may have the structure described in Embodiment 1; in such a case, the common electrode layer 4031 may be provided on the second substrate 4006 side, and the pixel electrode layer 4030 and the common electrode layer 4031 may be stacked with the liquid crystal layer 4008 interposed therebetween.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A columnar spacer denoted by reference numeral 4035 is obtained by selective etching of an insulating film and is provided in order to control the thickness (a cell gap) of the liquid crystal layer 4008. Note that a spherical spacer may be used. In the liquid crystal display device that uses the liquid crystal layer 4008, the thickness (the cell gap) of the liquid crystal layer 4008 is preferably about 5 µm to 20 µm.

Although FIGS. 12A1, 12A2, and 12B illustrate examples of transmissive liquid crystal display devices, an embodiment of the present invention can also be applied to a transflective liquid crystal display device.

FIGS. 12A1, 12A2, and 12B illustrate examples of liquid crystal display devices in which a polarizing plate is provided on the outer side (the view side) of a pair of substrates; however, the polarizing plates may be provided on the inner side of the pair of the substrates. Whether the polarizing plate is provided on the inner side or the outer side may be determined as appropriate depending on the material of the polarizing plate and conditions of the manufacturing process. Furthermore, a light-blocking layer serving as a black matrix may be provided.

The interlayer film 4021 is a light-transmitting chromatic color resin layer and serves as a color filter layer. A light-blocking layer may be included in part of the interlayer film 4021. In FIGS. 12A1, 12A2, and 12B, a light-blocking layer 4034 is provided on the second substrate 4006 side so as to cover the thin film transistors 4010 and 4011. By the light-blocking layer 4034, contrast can be increased and the thin film transistors can be stabilized more.

When a coloring layer of a light-transmitting chromatic color resin layer is used as the interlayer film 4021 provided over the thin film transistors, the intensity of incident light on the semiconductor layers of the thin film transistors can be attenuated without reduction in an aperture ratio of a pixel. Accordingly, electric characteristics of the thin film transistors can be prevented from being varied due to photosensitivity of the oxide semiconductor and can be stabilized. Further, the light-transmitting chromatic color resin layer can serve as a color filter layer. In the case of providing a color filter layer on the counter substrate side, precise positional alignment of a pixel region with an element substrate over which a thin film transistor is formed is difficult and accordingly there is a possibility that image quality is degraded. Here, since the interlayer film is formed as the color filter layer directly on the element substrate side, the formation region can be controlled more precisely and this structure is adjustable to a pixel with a fine pattern. In addition, one insulating layer can serve as both the interlayer film and the color filter layer, whereby the process can be simplified and a liquid crystal display device can be manufactured at low cost.

The thin film transistors may be covered with the insulating layer 4020 which serves as a protective film of the thin film transistors; however, there is no particular limitation to such a structure.

Note that the protective film is provided to prevent entry of impurities floating in air, such as an organic substance, a metal substance, or moisture, and is preferably a dense film. The protective film may be formed by a sputtering method to have a single-layer structure or a stacked structure including a silicon oxide film, a silicon nitride film, a silicon oxynitride film, a silicon nitride oxide film, an aluminum oxide film, an aluminum nitride film, an aluminum oxynitride film, and/or an aluminum nitride oxide film.

After the protective film is formed, the semiconductor layer may be subjected to annealing (300° C. to 400° C.).

Further, in the case of further forming a light-transmitting insulating layer as a planarizing insulating film, the light-transmitting insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer may be formed by stacking a plurality of insulating films formed of these materials.

A method for forming the insulating layer is not particularly limited, and the following method can be employed in accordance with the material: sputtering, an SOG method, spin coating, dip coating, spray coating, droplet discharging (e.g., ink jetting, screen printing, or offset printing), doctor knife, roll coating, curtain coating, knife coating, or the like. In the case where the insulating layer is formed using a material solution, the semiconductor layer may be annealed (at 200° C. to 400° C.) at the same time of a baking step. The baking step of the insulating layer serves also as the annealing step of the semiconductor layer, and thereby a liquid crystal display device can be manufactured efficiently.

The pixel electrode layer 4030 and the common electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the common electrode layer 4031.

In addition, a variety of signals and potentials are supplied to the signal line driver circuit 4003 that is formed separately, and the scanning line driver circuit 4004 or the pixel portion 4002 from an FPC 4018.

Further, since the thin film transistor is easily broken by static electricity and the like, a protection circuit for protecting the driver circuit is preferably provided over the same substrate for a gate line or a source line. The protection circuit is preferably formed using a nonlinear element in which an oxide semiconductor is used.

In FIGS. 12A1, 12A2, and 12B, a connection terminal electrode 4015 is formed using the same conductive film as that of the pixel electrode layer 4030, and a terminal electrode 4016 is formed using the same conductive film as that of source and drain electrode layers of the thin film transistors 4010 and 4011.

The connection terminal electrode 4015 is electrically connected to a terminal included in the FPC 4018 through an anisotropic conductive film 4019.

Although FIGS. 12A1, 12A2, and 12B illustrate an example in which the signal line driver circuit 4003 is formed separately and mounted on the first substrate 4001, the present invention is not limited to this structure. The scanning line driver circuit may be formed separately and then mounted, or only a part of the signal line driver circuit or a part of the scanning line driver circuit may be formed separately and then mounted.

Figure 16:
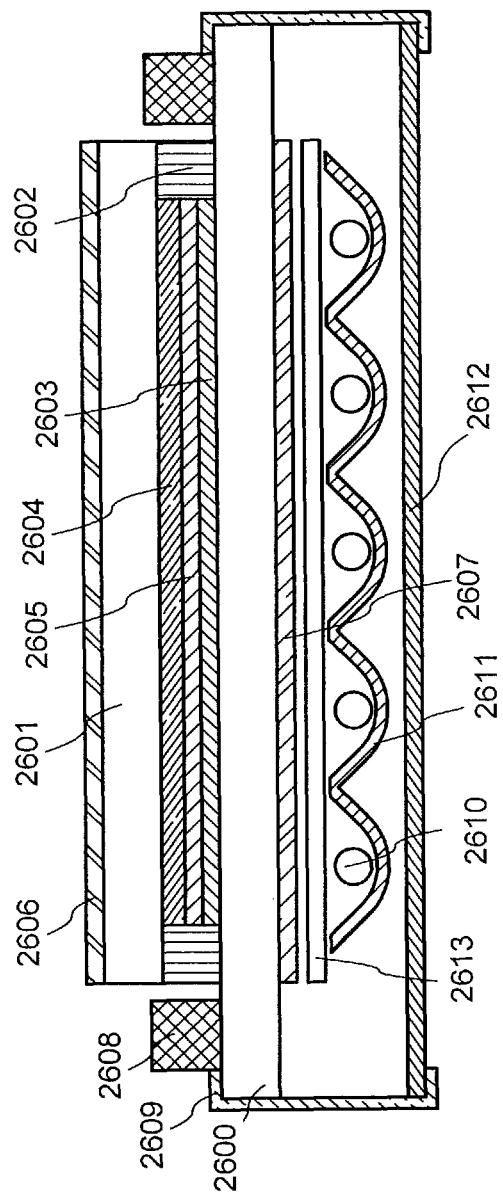
FIG. 16 illustrates a liquid crystal display module.

FIG. 16 illustrates an example of a liquid crystal display module which is formed as a liquid crystal display device disclosed in this specification.

FIG. 16 illustrates an example of the liquid crystal display module, in which an element substrate 2600 and a counter substrate 2601 are attached to each other with a sealant 2602, and an element layer 2603 including a TFT or the like, a display element 2604 including a liquid crystal layer, and an interlayer film 2605 including a light-transmitting chromatic color resin layer that serves as a color filter are provided between the substrates to form a display region. The interlayer film 2605 including a light-transmitting chromatic color resin layer is necessary to perform color display. In the case of the RGB system, respective light-transmitting chromatic color resin layers corresponding to colors of red, green, and blue are provided for respective pixels. The polarizing plate 2606 is provided on the outer side of the counter substrate 2601, and a polarizing plate 2607 and a diffuser plate 2613 are provided on the outer side of the element substrate 2600. A light source includes a cold cathode tube 2610 and a reflective plate 2611, and a circuit substrate 2612 is connected to a wiring circuit portion 2608 of the element substrate 2600 through a flexible wiring board 2609 and includes an external circuit such as a control circuit or a power source circuit. As the light source, a white diode may be used. The polarizing plate and the liquid crystal layer may be stacked with a retardation plate interposed therebetween.

As the liquid crystal display module to which Embodiment 1 is applied, the following can be used: an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Fenoelectric Liquid Crystal) mode, an AFLC (Anti Ferroelectric Liquid Crystal) mode, or the like.

Through the above process, a highly reliable liquid crystal display panel as a liquid crystal display device can be manufactured.

This embodiment can be implemented in combination with any of the structures disclosed in other embodiments as appropriate.

Embodiment 11

A liquid crystal display device disclosed in this specification can be applied to a variety of electronic devices (including a game machine). Examples of electronic devices include television sets (also referred to as televisions or television receivers), monitors of computers or the like, cameras such as digital cameras or digital video cameras, digital photo frames, mobile phones (also referred to as cellular phones or mobile phone sets), portable game consoles, portable information terminals, audio reproducing devices, large-sized game machines such as pachinko machines, and the like.

Figure 13A:
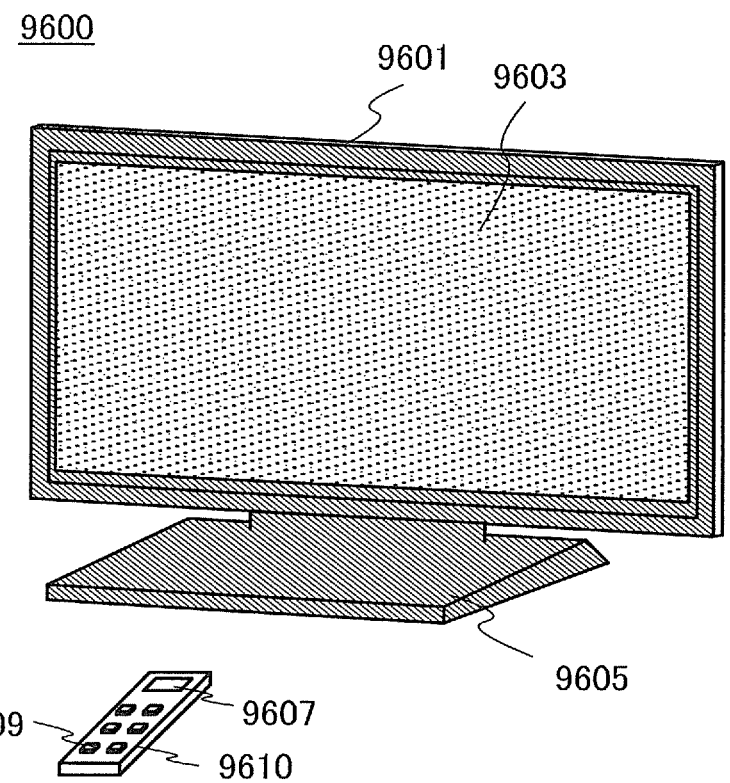
FIG. 13A is an external view illustrating an example of a television device and FIG. 13B is an external view illustrating an example of a digital photo frame.

FIG. 13A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 13B:
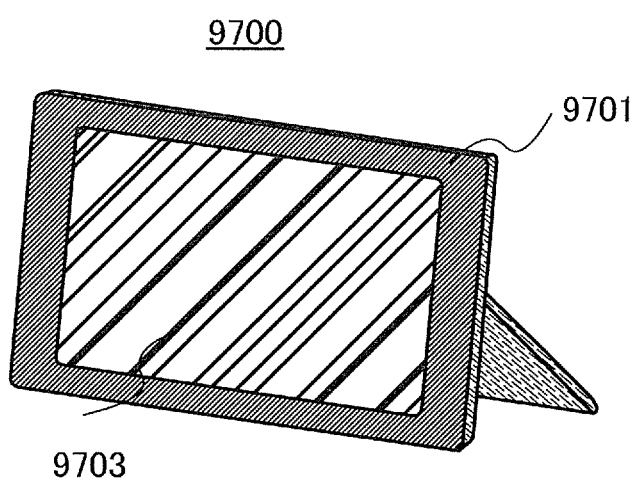

FIG. 13B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a storage medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 14A:
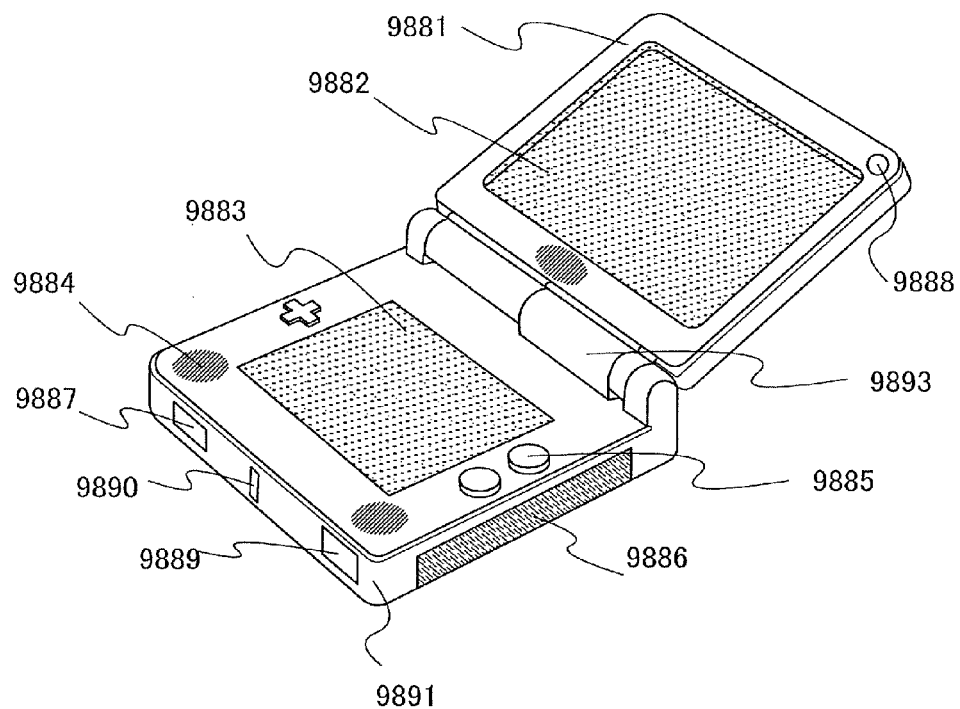
FIGS. 14A and 14B are external views illustrating examples of game machines.

FIG. 14A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 14A additionally includes a speaker portion 9884, a storage medium insertion portion 9886, an LED lamp 9890, an input means (operation keys 9885, a connection terminal 9887, a sensor 9888 (a sensor having a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. It is needless to say that the structure of the portable game machine is not limited to the above and other structures provided with at least a liquid crystal display device disclosed in this specification may be employed. The portable game machine may include other accessory equipments as appropriate. The portable game machine illustrated in FIG. 14A has a function of reading out a program or data stored in a storage medium to display it on the display portion, and a function of sharing information with another portable game machine by wireless communication. The portable game machine in FIG. 14A can have various functions without limitation to the above.

Figure 14B:
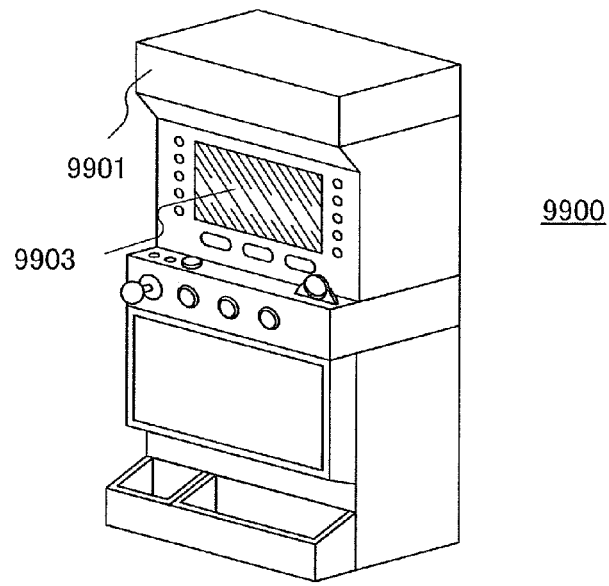

FIG. 14B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a liquid crystal display device disclosed in this specification may be employed. The slot machine may include other accessory equipments as appropriate.

Figure 15A:
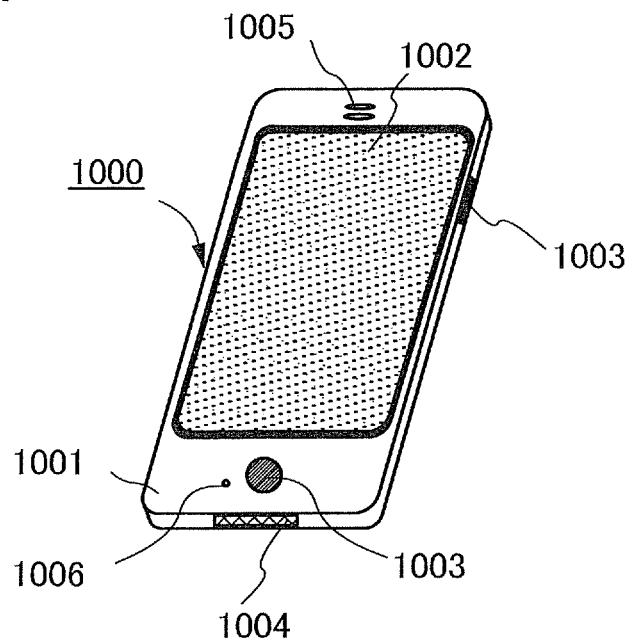
FIGS. 15A and 15B are external views illustrating examples of mobile phones.

FIG. 15A illustrates an example of a mobile phone 1000. The mobile phone 1000 is provided with a display portion 1002 incorporated in a housing 1001, operation buttons 1003, an external connection port 1004, a speaker 1005, a microphone 1006, and the like.

When the display portion 1002 of the mobile phone 1000 illustrated in FIG. 15A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the mobile phone 1000, display on the screen of the display portion 1002 can be automatically switched by determining the direction of the mobile phone 1000 (whether the mobile phone 1000 is placed horizontally or vertically for a landscape mode or a portrait mode).

The screen mode is switched by touching the display portion 1002 or operating the operation buttons 1003 of the housing 1001. Alternatively, the screen mode can be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 15B:
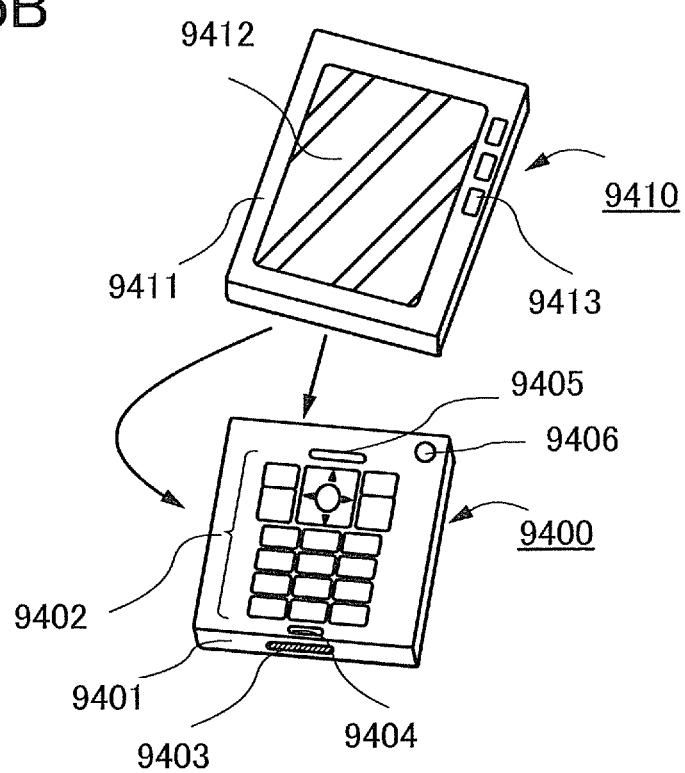

FIG. 15B also illustrates an example of a mobile phone. The mobile phone illustrated in FIG. 15B includes a display device 9410 having a display portion 9412 and operation buttons 9413 in a housing 9411 and a communication device 9400 having a scan buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by the arrows. Accordingly, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wired communication between the communication device 9400 and the display device 9410, each of which has a rechargeable battery.

This application is based on Japanese Patent Application serial no. 2008-304243 filed with Japan Patent Office on Nov. 28, 2008, the entire contents of which are hereby incorporated by reference.

What is claimed is:

1. A display device comprising:
   a thin film transistor comprising:
      a gate electrode layer;
      a first insulating layer over the gate electrode layer;
      a channel formation region containing an oxide semiconductor, the channel formation region being over the first insulating layer and overlapping with the gate electrode layer;
      an n-type region including one of a source region and a drain region; and
      a second insulating layer over the channel formation region;
   a pixel electrode layer electrically connected to the thin film transistor;
   a light-transmitting chromatic color resin layer between the thin film transistor and the pixel electrode layer;
   a display layer over the thin film transistor, the pixel electrode layer, and the light-transmitting chromatic color resin layer; and
   an electrode layer over the second insulating layer and overlapping with the gate electrode layer and the channel formation region,
   wherein the channel formation region is included in a semiconductor layer,
   wherein the n-type region includes crystals each having a diameter of 1 nm to 10 nm,
   wherein the light-transmitting chromatic color resin layer has a light transmittance lower than the semiconductor layer,
   wherein the light-transmitting chromatic color resin layer covers the channel formation region and the n-type region,
   wherein the gate electrode layer contains copper,
   wherein the first insulating layer is a stacked layer including a first layer and a second layer,
   wherein the first layer is a different layer from the second layer,
   wherein the first layer contains silicon and nitrogen,
   wherein the second layer contains silicon and oxygen,
   wherein the oxide semiconductor contains indium, gallium, and zinc,
   wherein the n-type region contains indium, gallium, zinc and oxygen,
   wherein the second insulating layer contains silicon and oxygen, and
   wherein a length of the gate electrode layer is larger than a length of the semiconductor layer in a direction parallel to a channel length direction of the thin film transistor.

2. The display device according to claim 1,
   wherein the light-transmitting chromatic color resin layer has a plurality of colors, and
   wherein each pixel in the display device includes the light-transmitting chromatic color resin layer having one color of the plurality of colors.

3. The display device according to claim 1, wherein a light-blocking layer is over the thin film transistor with the display layer interposed therebetween.

4. The display device according to claim 1,
   wherein the electrode layer is a common electrode layer, and
   wherein the common electrode layer is included between the light-transmitting chromatic color resin layer and the display layer.

5. The display device according to claim 1,
   wherein the electrode layer is a common electrode layer,
   wherein the common electrode layer is included between the light-transmitting chromatic color resin layer and the display layer, and
   wherein the pixel electrode layer and the common electrode layer have an opening pattern.

6. The display device according to claim 1,
   wherein the electrode layer is a common electrode layer,
   wherein the common electrode layer is included between the light-transmitting chromatic color resin layer and the display layer, and
   wherein the pixel electrode layer and the common electrode layer have a comb-shape.

7. The display device according to claim 1, wherein the display layer is a liquid crystal layer.

8. The display device according to claim 7, wherein the liquid crystal layer includes a liquid crystal material exhibiting a blue phase.

9. The display device according to claim 7, wherein the liquid crystal layer includes a chiral agent.

10. The display device according to claim 7, wherein the liquid crystal layer includes a photocurable resin and a photopolymerization initiator.

11. The display device according to claim 1, wherein the light-transmitting chromatic color resin layer overlaps with the pixel electrode layer.

12. The display device according to claim 1, further comprising a transparent insulating layer over the light-transmitting chromatic color resin layer.

13. The display device according to claim 1, wherein the n-type region is included in an n-type layer over the semiconductor layer.

14. A display device comprising:
a thin film transistor comprising:
  a gate electrode layer;
  a first insulating layer over the gate electrode layer;
  a channel formation region, the channel formation region being over the first insulating layer and overlapping with the gate electrode layer;
  an n-type region including one of a source and a drain;
  a source electrode and a drain electrode over the channel formation region including an oxide semiconductor; and
  a second insulating layer over the channel formation region;
a light-transmitting chromatic color resin layer over the second insulating layer;
a third insulating layer over and in direct contact with the light-transmitting chromatic color resin layer;
a pixel electrode layer electrically connected to one of the source electrode and the drain electrode of the thin film transistor; and
an electrode layer over the second insulating layer and overlapping with the gate electrode layer and the channel formation region,
wherein the channel formation region is included in a semiconductor layer,
wherein the n-type region includes crystals each having a diameter of 1 nm to 10 nm,
wherein the light-transmitting chromatic color resin layer has a light transmittance lower than the semiconductor layer,
wherein the light-transmitting chromatic color resin layer covers the channel formation region and the n-type region,
wherein the first insulating layer is a stacked layer including a first layer and a second layer,
wherein the first layer is a different layer from the second layer,
wherein the first layer contains silicon and nitrogen,
wherein the second layer contains silicon and oxygen,
wherein the oxide semiconductor contains indium, gallium, and zinc,
wherein the n-type region contains indium, gallium, zinc and oxygen,
wherein the second insulating layer contains silicon and oxygen,
wherein the pixel electrode layer contains indium tin oxide, and
wherein a length of the gate electrode layer is larger than a length of the semiconductor layer in a direction parallel to a channel length direction of the thin film transistor.

15. The display device according to claim 14 further comprising a display layer over the third insulating layer.

16. The display device according to claim 15, wherein the display layer is a liquid crystal layer.

17. The display device according to claim 14, wherein the gate electrode layer contains copper.

18. The display device according to claim 14, wherein the source electrode and the drain electrode contain molybdenum and titanium.

19. The display device according to claim 14,
wherein the light-transmitting chromatic color resin layer has a plurality of colors, and
wherein each pixel in the display device includes the light-transmitting chromatic color resin layer having one color of the plurality of colors.

20. The display device according to claim 14,
wherein the electrode layer is a common electrode layer, and
wherein the common electrode layer is over the third insulating layer.

21. The display device according to claim 14, wherein the n-type region is included in an n-type layer over the semiconductor layer.

* * * * *